(12) United States Patent
Kim et al.

(10) Patent No.: US 12,477,282 B2
(45) Date of Patent: *Nov. 18, 2025

(54) DISPLAY APPARATUS AND VEHICLE INCLUDING THE SAME

(71) Applicant: LG Display Co., Ltd., Seoul (KR)

(72) Inventors: Taehyung Kim, Paju-si (KR); SunBok Song, Paju-si (KR); Seunghyeon Kim, Paju-si (KR); SeulKi Nam, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 223 days.

This patent is subject to a terminal disclaimer.

(21) Appl. No.: 18/142,456

(22) Filed: May 2, 2023

(65) Prior Publication Data

US 2023/0300503 A1    Sep. 21, 2023

Related U.S. Application Data

(63) Continuation of application No. 17/359,483, filed on Jun. 25, 2021, now Pat. No. 11,689,835, which is a
(Continued)

(30) Foreign Application Priority Data

Jul. 22, 2019 (KR) ......................... 10-2019-0088593

(51) Int. Cl.
*H04R 9/06* (2006.01)
*H04R 1/02* (2006.01)
*H05K 5/00* (2025.01)

(52) U.S. Cl.
CPC ............. *H04R 9/06* (2013.01); *H04R 1/025* (2013.01); *H04R 1/028* (2013.01); *H05K 5/0018* (2022.08); *H04R 2499/15* (2013.01)

(58) Field of Classification Search
None
See application file for complete search history.

(56) References Cited

U.S. PATENT DOCUMENTS 9,818,805 B2    11/2017    Choi et al.
10,571,958 B2    2/2020    Lee et al.
(Continued)

FOREIGN PATENT DOCUMENTS

CN    108986712 A    12/2018
EP    3 343 272 A1    7/2018
(Continued)

OTHER PUBLICATIONS

Office Action dated Apr. 19, 2023, issued in corresponding Japanese Divisional Patent Application No. 2022-026783.
(Continued)

*Primary Examiner* — Walter F Briney, III
(74) *Attorney, Agent, or Firm* — Morgan, Lewis & Bockius LLP

(57) ABSTRACT

A display apparatus includes a display panel configured to display an image, a front member on a front surface of the display panel, a supporting member on a rear surface of the display panel, a supporting frame on a rear surface of the front member, the supporting frame configured to surround a side surface of the supporting member and support the supporting member, and a vibration generating module supported by the supporting member and configured to vibrate the display panel.

32 Claims, 10 Drawing Sheets

Related U.S. Application Data continuation of application No. 16/573,423, filed on Sep. 17, 2019, now Pat. No. 11,082,762.

(56) References Cited

U.S. PATENT DOCUMENTS

| | | | |
|---|---|---|---|
| 11,082,762 B2 | 8/2021 | Kim et al. | |
| 2010/0156857 A1 | 6/2010 | Nozaki | |
| 2015/0373441 A1 | 12/2015 | Behles et al. | |
| 2017/0280215 A1* | 9/2017 | Lee | H04R 7/045 |
| 2017/0287990 A1 | 10/2017 | Choi et al. | |
| 2018/0070391 A1* | 3/2018 | Galeotti | B60K 35/28 |
| 2018/0317000 A1 | 11/2018 | Ham et al. | |
| 2019/0014402 A1 | 1/2019 | Ahn et al. | |
| 2019/0037164 A1 | 1/2019 | Kim et al. | |
| 2019/0045287 A1* | 2/2019 | Lee | H04R 1/26 |
| 2019/0098411 A1 | 3/2019 | Ham et al. | |
| 2019/0182573 A1 | 6/2019 | Shin et al. | |
| 2019/0196679 A1 | 6/2019 | You et al. | |
| 2019/0208300 A1 | 7/2019 | Lee et al. | |
| 2020/0404213 A1* | 12/2020 | Won | H04R 1/26 |

FOREIGN PATENT DOCUMENTS

| | | |
|---|---|---|
| JP | 2005-134971 A | 5/2005 |
| JP | 2010-164946 A | 7/2010 |
| JP | 2011-126374 A | 6/2011 |
| JP | 2014-029372 A | 2/2014 |
| JP | 2016-509778 A | 3/2016 |
| JP | 2017-156623 A | 9/2017 |
| JP | 2017-188643 A | 10/2017 |
| JP | 2017-195613 A | 10/2017 |
| JP | 2018-101090 A | 6/2018 |
| JP | 2018-110369 A | 7/2018 |
| KR | 10-1746496 B1 | 6/2017 |
| KR | 10-2019-0006113 A | 1/2019 |
| KR | 10-2019-0029949 A | 3/2019 |
| KR | 10-2019-0033277 A | 3/2019 |
| KR | 10-2019-0068936 A | 6/2019 |
| WO | 2014/020937 A1 | 2/2014 |

OTHER PUBLICATIONS

Office Action dated Aug. 30, 2023, issued in corresponding Chinese Patent Application No. 201910887167.7.

Office Action dated Jan. 23, 2024, issued in corresponding Korean Patent Application No. 10-2019-0088593. (Note: KR 10-2019-0033277 A, US 2019/0098411 A1, KR 10-2019-0029949 A and US 2018/0070391 A1 were previously cited.).

Office Action dated May 31, 2021, issued in corresponding Japanese Patent Application No. 2020-120055.

Office Action dated May 20, 2024, issued in corresponding Japanese Patent Application No. 2023-133750. (Note: KR 10-2019-0033277 A, JP 2014-029372 A, JP 2018-101090 A, JP 2017-156623 A, JP 2011-126374 A, JP 2005-134971 A, US 2019/0014402 A1, US 2019/0037164 A1, and JP 2018-110369 A were previously submitted).

* cited by examiner

DISPLAY APPARATUS AND VEHICLE INCLUDING THE SAME

CROSS-REFERENCE TO RELATED APPLICATIONS

This application is a continuation of co-pending U.S. patent application Ser. No. 17/359,483, filed on Jun. 25, 2021, which is a continuation of U.S. patent application Ser. No. 16/573,423, filed on Sep. 17, 2019, now U.S. Pat. No. 11,082,762, which claims the benefit of and priority to Korean Patent Application No. 10-2019-0088593, filed on Jul. 22, 2019. The entirety of each of the above prior U.S. and Korean patent applications is hereby incorporated by reference.

BACKGROUND

Technical Field

The present disclosure relates to a display apparatus and a vehicle including the same.

Discussion of the Related Art

Display apparatuses are equipped in home appliances and other electronic apparatuses, such as televisions (TVs), monitors, notebook computers, smartphones, tablet computers, electronic organizers, electronic pads, wearable apparatuses, watch phones, portable information apparatuses, navigation apparatuses, and automotive control display apparatuses, and are used as a screen for displaying an image.

Display apparatuses may include a display panel for displaying an image and a sound device for outputting a sound associated with the image. However, in general display apparatuses, because a sound output from a sound device may travel to a rearward or a downward direction of the display apparatus, sound quality may be degraded due to interference between sounds reflected from a wall and the ground. For this reason, it may be difficult to transfer an accurate sound, and an immersion experience of a viewer is reduced.

SUMMARY

Accordingly, an embodiment of the present disclosure is directed to a display apparatus and a vehicle including the same that substantially obviate one or more problems due to limitations and disadvantages of the related art.

The inventors have recognized problems of general display apparatuses and have performed various experiments so that, when a user in front of a display panel is watching an image, a traveling direction of sound is toward a front surface of the display panel. Thus, sound quality may be enhanced. Through the various experiments, the inventors have invented a display apparatus that may generate sound that travels to a forward region in front of the display panel, thereby enhancing sound quality.

An aspect of the present disclosure is to provide a display apparatus and a vehicle including the same, which output a sound to a forward region in front of a display panel.

Another aspect of the present disclosure is to provide a display apparatus and a vehicle including the same, which improve sound quality and increase an immersion experience of a viewer or listener.

Another aspect of the present disclosure is to provide a display apparatus with enhanced sound performance and sound pressure characteristics, and a vehicle including the display apparatus.

Another aspect of the present disclosure is to provide a display apparatus for preventing or minimizing damage to a driving circuit caused by a vibration of a display panel and a vehicle including the same.

Additional advantages and features of the disclosure will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described herein, there is provided a display apparatus comprising a display panel configured to display an image; a front member on a front surface of the display panel; a supporting member on a rear surface of the display panel; a supporting frame on a rear surface of the front member, the supporting frame configured to surround a side surface of the supporting member and support the supporting member; and a vibration generating module supported by the supporting member and configured to vibrate the display panel.

In another aspect, there is provided a display apparatus comprising a display panel configured to display an image; a front member on a front surface of the display panel; a supporting frame on a rear surface of the front member, the supporting frame including an opening overlapping the display panel; a supporting member at the opening of the supporting frame, the supporting member configured to surround a side surface of the display panel; a printed circuit board on a rear surface of the supporting member; and a vibration generating module supported by the supporting member and configured to vibrate the display panel.

In another aspect, there is provided a vehicle comprising a dashboard including a first region facing a driver seat; and an instrument panel module including a first display in the first region of the dashboard, wherein the first display comprises a display apparatus including a display panel configured to display an image; a front member on a front surface of the display panel; a supporting member on a rear surface of the display panel; a supporting frame on a rear surface of the front member, the supporting frame configured to surround a side surface of the supporting member and support the supporting member; and a vibration generating module supported by the supporting member and configured to vibrate the display panel.

In another aspect, there is provided a vehicle comprising a dashboard including a first region facing a driver seat, a second region facing a passenger seat, and a third region between the first region and the second region; an instrument panel module including a first display in the first region of the dashboard; and an infotainment module including a second display in the third region of the dashboard, a third display in the second region of the dashboard, a fourth display on a rear surface of the driver seat, and a fifth display on a rear surface of the passenger seat, wherein at least one of the first to fifth displays comprises a display apparatus including a display panel configured to display an image; a front member on a front surface of the display panel; a supporting member on a rear surface of the display panel; a supporting frame on a rear surface of the front member, the supporting frame configured to surround a side surface of the supporting member and support the supporting member; and a vibration generating module supported by the supporting member and configured to vibrate the display panel.

In another aspect, there is provided a vehicle comprising a dashboard including a display apparatus including a display panel configured to display an image; a front member on a front surface of the display panel; a supporting member on a rear surface of the display panel; a supporting frame on a rear surface of the front member, the supporting frame configured to surround a side surface of the supporting member and support the supporting member; and a vibration generating module supported by the supporting member and configured to vibrate the display panel.

The display apparatus and the vehicle including the same according to an embodiment of the present disclosure may output sound to a forward region in front of a display panel and may output sound with improved sound quality, performance, and sound pressure characteristics, thereby increasing an immersion experience of a viewer or listener.

Moreover, the display apparatus and the vehicle including the same according to an embodiment of the present disclosure may prevent or minimize damage of a driving circuit caused by a vibration of a display panel, thereby enhancing the reliability of the driving circuit.

Moreover, the display apparatus and the vehicle including the same according to an embodiment of the present disclosure may increase a sound pressure level, sound quality, and reproduction band of a sound generated by a vibration of the display panel.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this application, illustrate embodiments of the disclosure and together with the description serve to explain various principles of the disclosure.

DETAILED DESCRIPTION

Figure 1:
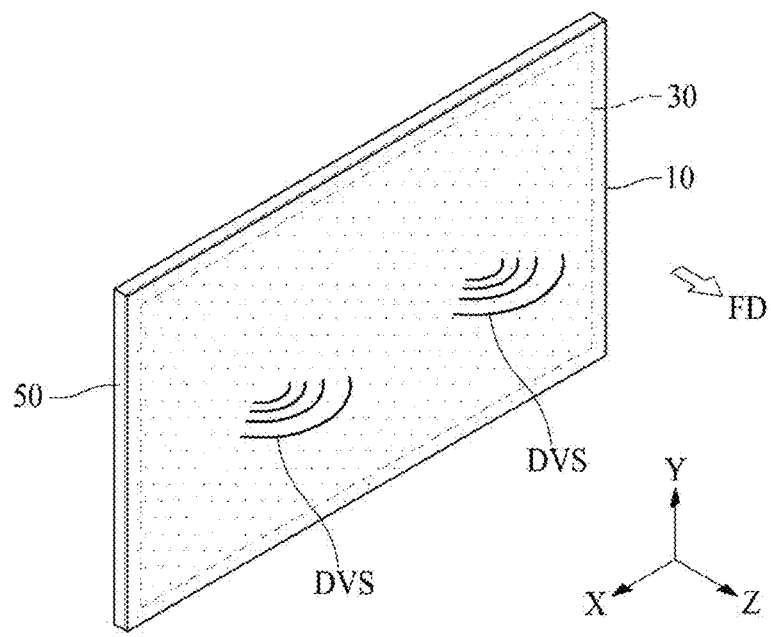
FIG. 1 illustrates a display apparatus according to an embodiment of the present disclosure.

Reference will now be made in detail to embodiments of the present disclosure, examples of which may be illustrated in the accompanying drawings.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

Throughout the drawings and the detailed description, unless otherwise described, the same drawing reference numerals should be understood to refer to the same elements, features, and structures. The relative size and depiction of these elements may be exaggerated for clarity, illustration, and convenience.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

When "comprise," "have," and "include" described in the present specification are used, another part may be added unless "only" is used. The terms of a singular form may include plural forms unless referred to the contrary.

In construing an element, the element is construed as including an error or tolerance range although there is no explicit description of such an error or tolerance range. In describing a position relationship, for example, when a position relation between two parts is described as, for example, "on," "over," "under," and "next," one or more other parts may be disposed between the two parts unless a more limiting term, such as "just" or "direct(ly)" is used. In describing a time relationship, for example, when the temporal order is described as, for example, "after," "subsequent," "next," and "before," a case that is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," "A," "B," "(a)," "(b)," etc. may be used. These terms are intended to identify the corresponding elements from the other elements, and basis, order, or number of the corresponding elements should not limited by these terms. The expression that an element is "connected," "coupled," or "adhered" to another element or layer the element or layer can not only be directly connected or adhered to another element or layer, but also be indirectly connected or adhered to another element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto, unless otherwise specified.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of a display apparatus and a vehicle including the same according to an embodiment of the present disclosure will be described in detail with reference to the accompanying drawings. In adding reference numerals to elements of each of the drawings, although the same elements are illustrated in other drawings, like reference numerals may refer to like elements. In the following description, when the detailed description of the relevant known function or configuration is determined to unnecessarily obscure the present disclosure, the detailed description may be omitted. Also, for convenience of description, a scale of each of elements illustrated in the accompanying drawings differs from a real scale, and thus, is not limited to a scale illustrated in the drawings.

When a driving circuit of a display apparatus is directly disposed on a rear surface of a display panel, the inventors have recognized a problem where a desired sound is not transferred via vibration of a vibration generating module to the display panel due to the driving circuit. Also, when the vibration generating module is applied to an automotive display apparatus having a relatively small size, the inventors have recognized a problem where the driving circuit is damaged by a vibration of the vibration generating module. Therefore, the inventors have performed various experiments for decreasing the damage to the driving circuit caused by the vibration generating module. Through the various experiments, the inventors have invented a display apparatus having a new structure, which may prevent the driving circuit from being damaged by the vibration generating module, decrease a contact between the driving circuit and the display panel to reduce a vibration caused by the driving circuit, and enhance a sound of the vibration generating module.

FIG. 1 illustrates a display apparatus according to an embodiment of the present disclosure.

With reference to FIG. 1, the display apparatus according to an embodiment of the present disclosure may output sound DVS (or a display vibration sound) according to a vibration of a display panel 30 for displaying an image. Therefore, the display apparatus according to an embodiment of the present disclosure may output the sound DVS using the display panel 30 as a vibration plate, and thus, may output the sound DVS to a forward region FD in front of a screen of the display panel 30. The display apparatus may thereby transfer an accurate sound, improve sound quality, and increase an immersion experience of a viewer or a listener.

Figure 2:
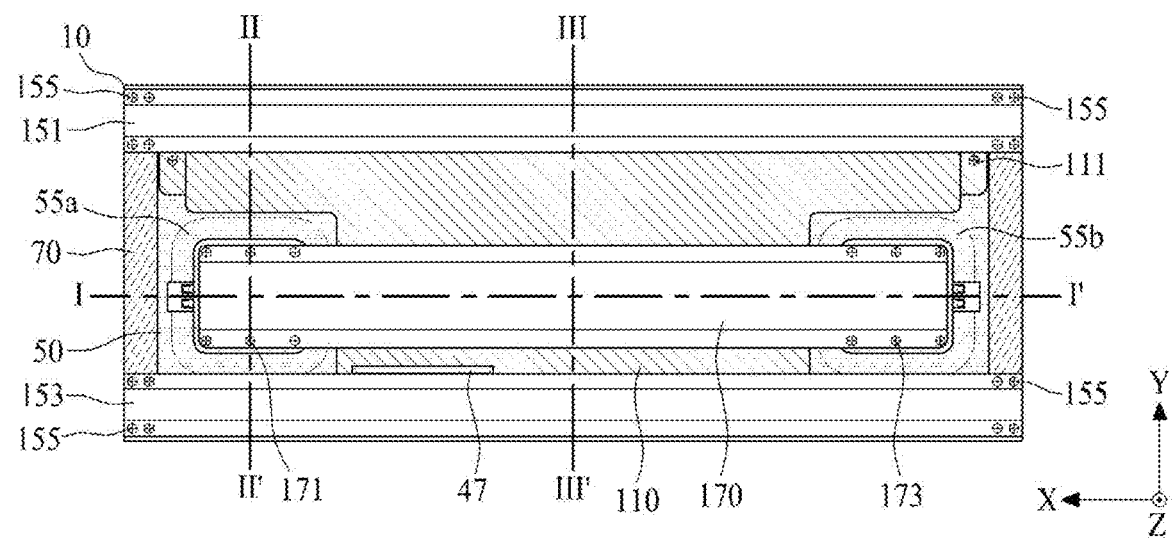
FIG. 2 illustrates a rear surface of a display apparatus illustrated in FIG. 1.
Figure 3:
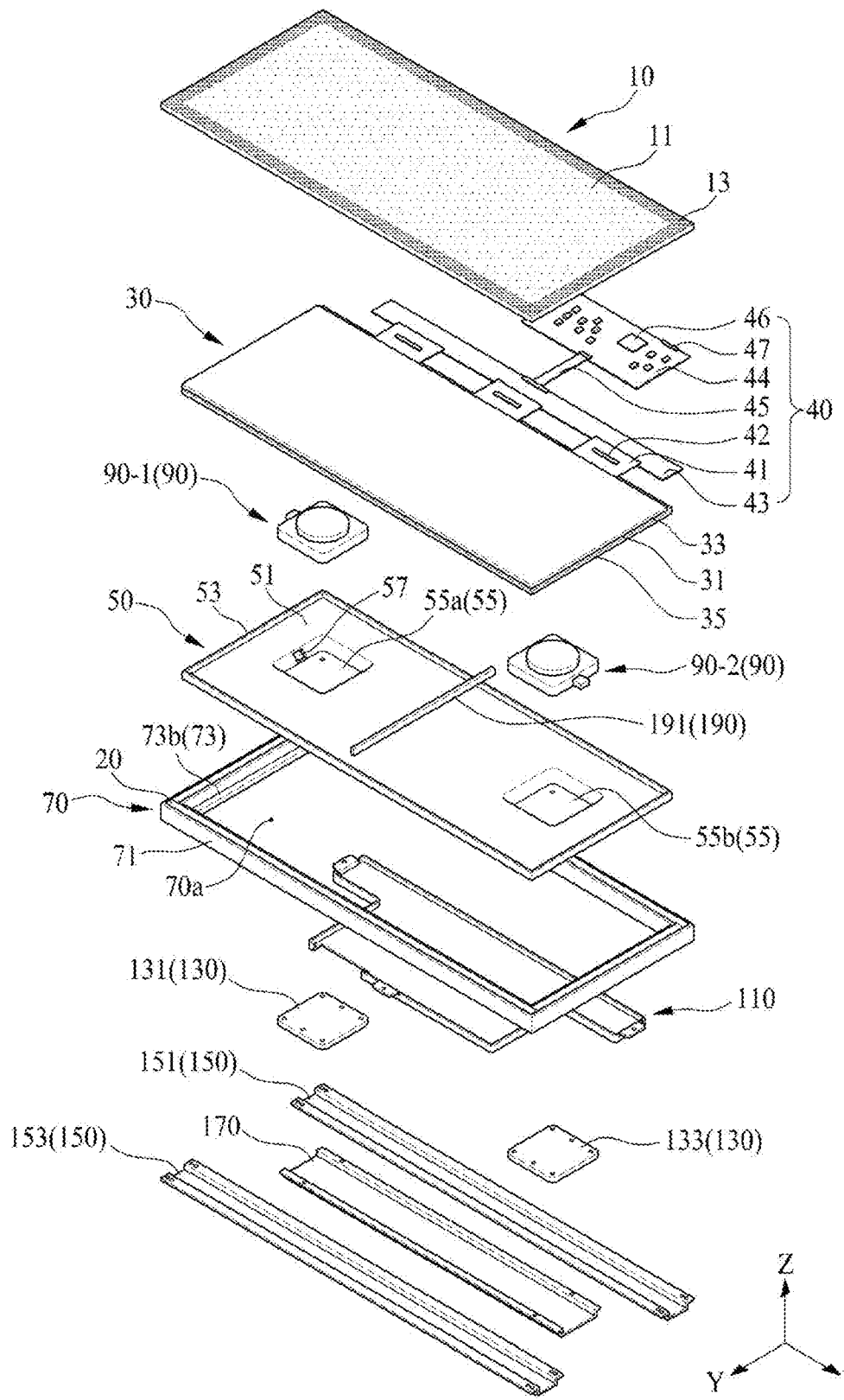
FIG. 3 is an exploded perspective view of the display apparatus illustrated in FIGS. 1 and 2.
Figure 4:
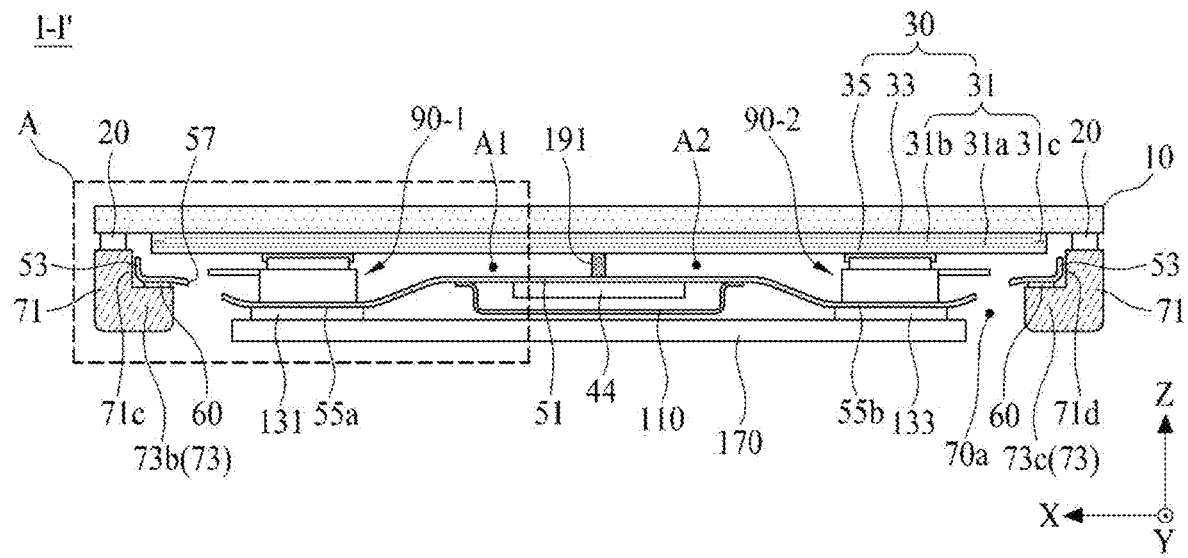
FIG. 4 is a cross-sectional view taken along line I-I' illustrated in FIG. 2.
Figure 5:
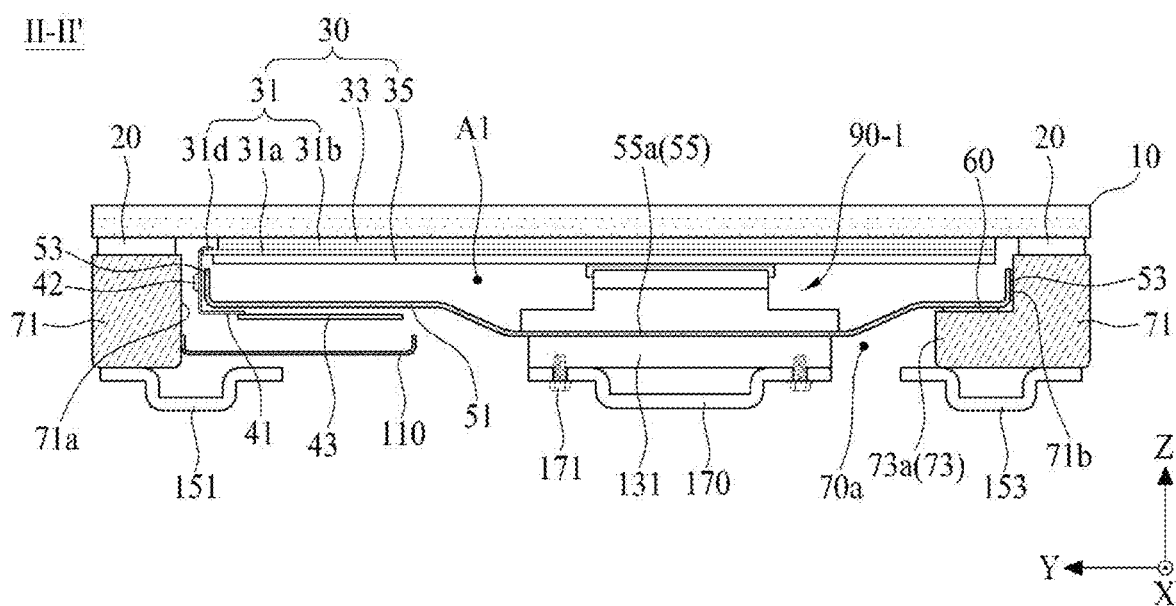
FIG. 5 is a cross-sectional view taken along line II-II' illustrated in FIG. 2.
Figure 6:
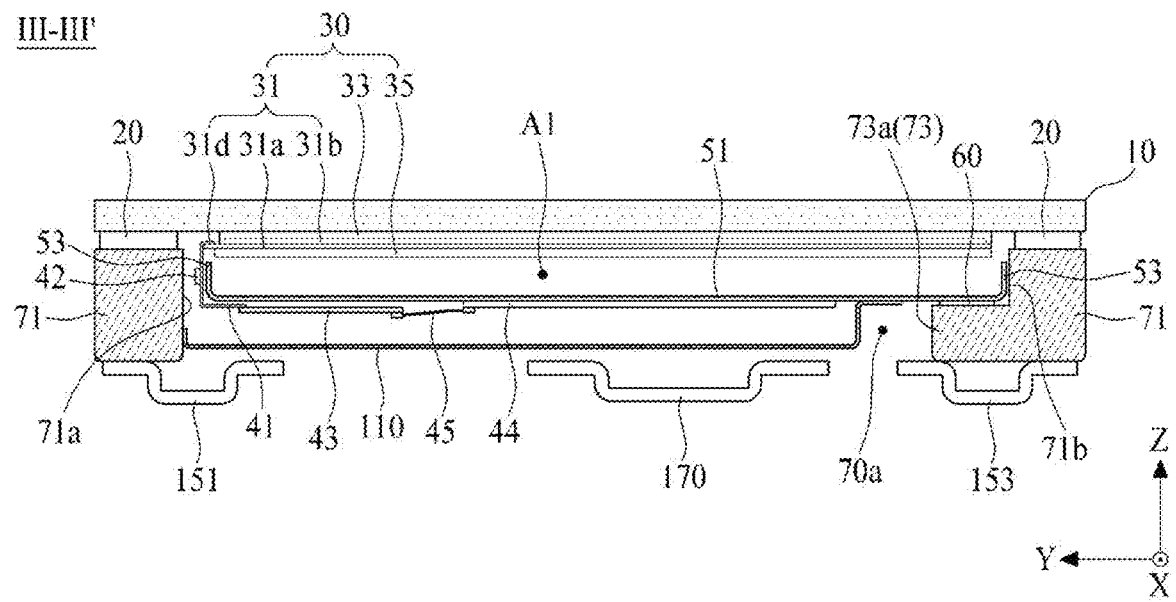
FIG. 6 is a cross-sectional view taken along line III-III' illustrated in FIG. 2.

FIG. 2 illustrates a rear surface of the display apparatus illustrated in FIG. 1. FIG. 3 is an exploded perspective view of the display apparatus illustrated in FIGS. 1 and 2. FIG. 4 is a cross-sectional view taken along line I-I' illustrated in FIG. 2. FIG. 5 is a cross-sectional view taken along line II-II' illustrated in FIG. 2. FIG. 6 is a cross-sectional view taken along line III-III' illustrated in FIG. 2.

With reference to FIGS. 2 to 6, a display apparatus according to an embodiment of the present disclosure may include a front member 10, a display panel 30, a supporting member 50, a supporting frame 70, and a vibration generating module 90.

The front member 10 may configure a foremost structure of the display apparatus and may protect a screen of the display panel 30. The front member 10 may be disposed (or provided) on a front surface of the display panel 30. For example, the front member 10 may cover (or overlay) the front surface of the display panel 30 to protect the display panel 30 from an external impact. Also, the front member 10 may vibrate along with the vibration of the display panel 30 to generate a sound DVS.

The front member 10 according to an embodiment of the present disclosure may include a transparent plastic material, a glass material, or a tempered glass material. For example, the front member 10 may include one of sapphire glass and gorilla glass or a stacked structure thereof, but is not limited thereto. As another example, the front member 10 may include a transparent plastic material such as polyethyleneterephthalate (PET). The front member 10 may include tempered glass based on a scratch resistance and transparency. For example, the front member 10 may be a "front structure," a "front window," a "cover window," a "glass window," a "cover screen," a "screen cover," or a "window glass," but the term is not limited thereto.

With reference to FIG. 3, the front member 10 may cover (or overlay) a non-display area other than a display area of the display panel 30. The front member 10 according to an embodiment of the present disclosure may include a transparent area 11 overlapping the display area of the display panel 30 and a light blocking area 13 overlapping the non-display area of the display panel 30. The light blocking area 13 may cover not only the non-display area of the display panel 30 but also the non-display area where an image is not displayed on the display apparatus.

The front member 10 according to an embodiment of the present disclosure may have a polygonal shape such as a rectangular shape or a square shape, or may have a non-polygonal shape including at least one side having a curve shape.

The display panel 30 may be disposed on a rear surface (or a back surface) of the front member 10 and may display an image. The display panel 30 may act as a touch sensor that senses a user touch applied to the front member 10. The display panel 30 may output the sound DVS according (or responding) to a vibration of the vibration generating module 90, or may generate a haptic feedback (or a haptic vibration) responding to the user touch.

The display panel 30 may be disposed on the rear surface of the front member 10 through a bonding process using a panel bonding member or a transparent adhesive member. The panel bonding member may include a pressure sensitive adhesive (PSA), an optically clear adhesive (OCA), or an optically clear resin (OCR), but is not limited thereto.

The display panel 30 may include a self-emitting display panel or a curved type self-emitting display panel. For example, the display panel 30 may include a light-emitting display panel, a micro light-emitting diode display panel, a flexible light-emitting display panel, or a flexible micro light-emitting diode display panel, but is not limited thereto.

The display panel 30 according to an embodiment of the present disclosure may have a polygonal shape such as a rectangular shape or a square shape, or may have a non-polygonal shape including at least one side having a curve shape. The display panel 30 may have a shape that is the same as or different from that of the front member 10. For example, the front member 10 may have a rectangular shape, and the display panel 30 may have a rectangular shape having a size that is less than that of the front member 10. As another example, the front member 10 may have a non-polygonal shape, and the display panel 30 may have a non-polygonal shape or a rectangular shape each having a size that is less than that of the front member 10.

With reference to FIG. 4, the display panel 30 according to an embodiment of the present disclosure may include a pixel array substrate 31 comprising a pixel array layer 31*b* including a plurality of pixels and an encapsulation layer 33 covering (or overlaying) the pixel array layer 31*b*.

The pixel array substrate 31 may include a base substrate 31*a* and the pixel array layer 31*b* disposed on the base substrate 31*a*.

The base substrate 31*a* may include a plastic material or a glass material.

The pixel array layer 31*b* may comprise a pixel array including the plurality of pixels provided in the display area on the base substrate 31*a*.

The plurality of pixels may be respectively provided in a plurality of pixel areas defined by a plurality of pixel driving lines including a plurality of gate lines and a plurality of data lines. Each of the plurality of pixels according to an embodiment of the present disclosure may include a pixel circuit having at least two thin film transistors (TFTs) and at least one capacitor, and a light-emitting device layer that emits light with a current supplied from the pixel circuit.

The light-emitting device layer in each of the plurality of pixels may include a first electrode connected to a corresponding pixel circuit, a light-emitting device on the first electrode, and a second electrode on (or connected to) the light-emitting device. For example, the light-emitting device may include an organic light-emitting layer or a quantum dot light-emitting layer. As another example, the light-emitting device may include a micro light-emitting diode, but is not limited thereto.

The light-emitting device layer according to an embodiment of the present disclosure may have a top emission structure (or a front emission structure) where light emitted from the light-emitting device passes through the encapsulation layer 33 and is transferred (or outputted) toward the front member 10. For example, in the light-emitting device layer based on the top emission structure (or the front emission structure), the first electrode may be a reflective electrode, and the second electrode may be a transparent electrode. For example, the first electrode may include a light reflecting material, and the second electrode may include a light transmitting material.

According to another embodiment, the light-emitting device layer may have a bottom emission structure (or a lower emission structure) where light emitted from the light-emitting device passes through the pixel array substrate 31 and is transferred (or outputted) toward the front member 10. For example, in the light-emitting device layer based on the bottom emission structure (or the lower emission structure), the first electrode may be a transparent electrode, and the second electrode may be a reflective electrode. The first electrode may include a light transmitting material, and the second electrode may include a light reflecting material. However, the present disclosure is not limited thereto, and the light-emitting device layer may have a dual emission structure.

With reference to FIG. 4, the pixel array substrate 31 may further include a gate driving circuit 31*c* that is disposed in the non-display area of the base substrate 31*a*.

The gate driving circuit 31*c* may be disposed in the non-display area of the base substrate 31*a* and may be connected to the plurality of gate lines. The gate driving circuit 31*c* may be disposed in at least one of a left non-display area and a right non-display area of the base substrate 31*a*. For example, the gate driving circuit 31*c* may be implemented with a shift register including a plurality of transistors in the non-display area through a process of forming a TFT in each of the plurality of pixel areas. In this case, the gate driving circuit 31*c* may be a built-in gate driving circuit or a built-in gate driver, but the term is not limited thereto.

With reference to FIGS. 3 to 6, the encapsulation layer 33 may be on the pixel array substrate 31 to surround the pixel array layer 31*b*, and thus, may prevent or block penetration of oxygen and/or water into the light-emitting device of the pixel array layer 31*b*. The encapsulation layer 33 according to an embodiment of the present disclosure may be in a multi-layer structure where an organic material layer and an inorganic material layer are alternately stacked, but is not limited thereto. The inorganic material layer may prevent or block penetration of oxygen and/or water into the light-emitting device. Also, the organic material layer may have a thickness that is thicker than that of the inorganic material layer, so as to cover particles occurring in a manufacturing process, but is not limited thereto.

The display panel 30 according to an embodiment of the present disclosure may further include a protection substrate on the encapsulation layer 33. The protection substrate (or an encapsulation substrate) may be disposed on or coupled to a front surface of the encapsulation layer 33 by a filler or an adhesive. For example, when the light-emitting device layer has the top emission structure, the protection substrate may include a transparent material. As another example, when the light-emitting device layer has the bottom emission structure, the protection substrate may include a transparent material, an opaque material, or a metal material. For example, when the light-emitting device layer has the top emission structure, the protection substrate may be omitted.

The display panel 30 according to an embodiment of the present disclosure may further include an optical film.

The optical film may be a polarizing film that prevents or minimizes reflection of external light to enhance the visibility and contrast ratio of the display panel 30. The polarizing film may circularly polarize the external light reflected by the TFT and/or the pixel driving lines provided on the pixel array substrate 31, thereby preventing or minimizing reflection of the external light.

When the light-emitting device layer has the top emission structure, the optical film according to an embodiment of the present disclosure may be disposed (or attached) on an upper surface (or a front surface) of the encapsulation layer 33 by a transparent adhesive member. When the display panel 30 includes the optical film, the protection substrate may be omitted.

According to another embodiment of the present disclosure, when the light emitting device layer has the bottom emission structure, the optical film may be disposed (or attached) on a rear surface of the pixel array substrate 31 by a transparent adhesive member.

The display panel 30 according to an embodiment of the present disclosure may further include a touch electrode layer for sensing a user touch applied to the front member 10.

The touch electrode layer may include a plurality of touch electrodes for sensing the user touch. Each of the plurality of touch electrodes may act as a touch sensor for sensing the user touch, based on a mutual capacitance type or a self-capacitance type.

The touch electrode layer according to an embodiment of the present disclosure may be implemented as a touch panel including the plurality of touch electrodes. For example, when the light-emitting device layer has the top emission structure, an add-on type touch panel may be disposed on or coupled to the encapsulation layer 33 or the optical film, and when the light-emitting device layer has the bottom emission structure, the add-on type touch panel may be on or coupled to the rear surface of the pixel array substrate 31.

According to another embodiment of the present disclosure, the touch electrode layer may be directly on the encapsulation layer 33, based on an in-cell type. For example, when the light-emitting device layer has the top emission structure, an in-cell type touch electrode layer may be directly on the front surface of the encapsulation layer 33.

The display panel 30 according to an embodiment of the present disclosure may further include a color filter layer on the encapsulation layer 33 to overlap each of the plurality of pixels. The light-emitting device provided in each of the plurality of pixels may emit white light. For example, when the light-emitting device layer has the top emission structure, the color filter layer may be on the encapsulation layer 33. As another example, when the light-emitting device layer has the bottom emission structure, the color filter layer may be in the pixel array layer 31b.

The display panel 30 according to an embodiment of the present disclosure may further include a back plate 35.

The back plate 35 may have the same shape as that of the pixel array substrate 31. For example, when the light-emitting device layer has the top emission structure, the back plate 35 may be on the rear surface (or a back surface) of the pixel array substrate 31 by a transparent adhesive member. As another example, when the light-emitting device layer has the bottom emission structure, the back plate 35 may be a protection substrate.

The back plate 35 may increase stiffness of the display panel 30 and may dissipate heat that occurs in the display panel 30. The back plate 35 according to an embodiment of the present disclosure may include a metal material having a high thermal conductivity. For example, the back plate 35 may include one or more of aluminum (Al), copper (Cu), silver (Ag), and magnesium (Mg) or an alloy thereof or may include a stainless steel material, but is not limited thereto. The back plate 35 may be a "heat diffusion sheet," a "heat diffusion layer," a "heat diffusion plate," a "heat sink," a "heat dissipation sheet," a "heat dissipation layer," or a "heat dissipation plate," but the term is not limited thereto.

With reference to FIG. 3, the supporting member 50 may be on a rear surface (or a back surface) of the display panel 30 and may cover (or overlay) the rear surface of the display panel 30. The supporting member 50 may support or accommodate the vibration generating module 90. The supporting member 50 may have the same shape as that of the display panel 30 and may be accommodated into or supported by the supporting frame 70.

The supporting member 50 according to an embodiment of the present disclosure may include a metal material or a metal alloy material each having a thickness of 0.5 mm or less, for decreasing a weight of the display apparatus. For example, the supporting member 50 may include one material of Al, an Al alloy, a Mg alloy, an iron-nickel (Fe—Ni) alloy, and stainless steel, or an alloy thereof or may have a junction structure, but is not limited thereto. The supporting member 50 may be a "rear cover," a "back cover," or a "rear member," but the term is not limited thereto.

The supporting member 50 according to an embodiment of the present disclosure may include a supporting plate 51 and a side portion 53. The supporting plate 51 may be a "cover plate," but the term is not limited thereto. The side portion 53 may include a "sidewall" and a "cover sidewall," but the term is not limited thereto.

The supporting plate 51 may be disposed to face the rear surface (or back surface) of the display panel 30 and may cover (or overlay) the rear surface of the display panel 30.

The side portion 53 may be bent from a periphery portion of the supporting plate 51. The side portion 53 may surround side surfaces of the display panel 30, protect the side surfaces of the display panel 30, and increase stiffness of the supporting member 50.

The side portion 53 according to an embodiment of the present disclosure may be spaced apart from the rear surface of the display panel 30. An uppermost surface (or an end) of the side portion 53 may be spaced apart from the rear surface (or back surface) of the front member 10 with respect to a thickness direction Z of the display panel 30. For example, the side portion 53 may directly contact the rear surface of the front member 10, but in this case, when the display panel 30 vibrates based on a vibration of the vibration generating module 90, the front member 10 may physically contact the side portion 53. Due to this, a noise may occur or the vibration of the display panel 30 may decrease, causing a reduction in quality of a sound DVS generated by the vibration of the display panel 30. Therefore, a height of the side portion 53 may be set to a range that allows the side portion 53 not to directly contact the rear surface of the front member 10 that vibrates along with the vibration of the display panel 30.

When the supporting member 50 does not have sufficient stiffness, the inventors have recognized a problem where the supporting member 50 absorbs a portion of energy of the vibration generating module 90. For example, because the supporting member 50 absorbs the energy of the vibration generating module 90, an insufficient vibration corresponding to the amount of energy absorbed by the supporting member 50 may be transferred to the display panel 30. Therefore, due to the insufficient vibration of the vibration generating module 90, it may be difficult for the display panel 30 to output a sufficient sound. For this reason, when the energy or vibration of the vibration generating module 90 is lost, the inventors have recognized a problem where it is difficult for the display panel 30 to output a desired sound. Therefore, the inventors have performed various experiments for increasing or reinforcing stiffness of the supporting member 50. Another structure may be additionally provided in the supporting member 50 to increase stiffness of the supporting member 50, but in this case, there may be a problem where a thickness of the display apparatus is thickened. Through the various experiments, the inventors have provided a forming portion or accommodating portion (or a stiffness reinforcement structure) in the supporting member 50, for increasing or reinforcing stiffness of the supporting member 50 without any increase in thickness of the display apparatus. This is described below.

With reference to FIGS. 2 to 5, the supporting member 50 according to an embodiment of the present disclosure may further include one accommodating portion 55 or a plurality of accommodating portions 55. The plurality of accommodating portions 55 may be arranged in parallel with each other. The accommodating portion 55 may support the vibration generating module 90 and may increase or reinforce stiffness of the supporting member 50. The accommodating portion 55 may minimize an increase in thickness (or height) of the display apparatus caused by a thickness (or a height) of the vibration generating module 90, thereby slimming the display apparatus.

The accommodating portion 55 may be provided to be concave from the supporting plate 51. For example, the accommodating portion 55 may protrude from the supporting plate 51 in a rearward direction opposite to a forward direction toward the rear surface of the display panel 30, and thus, may be concavely provided on the supporting plate 51. However, the present disclosure is not limited thereto. The accommodating portion 55 may be a "groove portion," a "concave portion," a "protrusion portion," an "engraved portion," an "forming portion," or a "stiffness reinforcement portion," but the term is not limited thereto.

The supporting member 50 according to an embodiment of the present disclosure may include a first accommodating portion 55a and a second accommodating portion 55b, which are concavely provided in the supporting plate 51. The first accommodating portion 55a and the second accommodating portion 55b may be disposed in parallel with each other. The shape of first accommodating portion 55a and the second accommodating portion 55b may be provided to be concave, but the shape is not limited thereto.

The first accommodating portion 55a may be concavely provided in a first region of the supporting plate 51 overlapping a first rear surface of the display panel 30. For example, the first accommodating portion 55a may be concavely provided in the first region of the supporting plate 51 overlapping a left rear region of the display panel 30 with respect to a first length center portion of the display panel 30 parallel to a first direction X.

The second accommodating portion 55b may be concavely provided in a second region of the supporting plate 51 overlapping a second rear surface of the display panel 30. For example, the second accommodating portion 55b may be concavely provided in the second region of the supporting plate 51 overlapping a right rear region of the display panel 30 with respect to the first length center portion of the display panel 30 parallel to the first direction X.

Each of the first accommodating portion 55a and the second accommodating portion 55b may include a bottom surface and an inclined surface between the bottom surface and the supporting plate 51.

The supporting member 50 according to an embodiment of the present disclosure may further include a hole 57 in the accommodating portion 55. The hole 57 may act as a cable through hole or a cable hole, through which a signal cable connected to the vibration generating module 90 passes. For example, the hole 57 may be provided to pass through the inclined surface of the accommodating portion 55.

With reference to FIGS. 2 to 6, the supporting frame 70 may surround side surfaces of the supporting member 50 and may support the supporting member 50. The supporting frame 70 may be on an outermost surface of the display apparatus and may be directly exposed at the outside of the display apparatus. The supporting frame 70 may be an "outermost frame," an "outermost mold material," an "outermost mechanism," a "guide frame," a "guide panel," an "edge frame," or a "mold frame," but the term is not limited thereto. The supporting frame 70 may have the same shape as that of the front member 10.

The supporting frame 70 may be on the rear surface of the front member 10. The supporting frame 70 may be disposed at a rear periphery portion of the front member 10.

The supporting frame 70 may be disposed at (or connected to) the rear periphery portion of the front member 10 by a first connection member (or a frame connection member) 20.

The first connection member 20 may be disposed (or connected) between the rear periphery portion of the front member 10 and the supporting frame 70, and thus, the supporting frame 70 may be disposed on (or connected to) the rear surface of the front member 10. The first connection member 20 according to an embodiment of the present disclosure may include an adhesive resin, a double-sided tape having an adhesive layer, or a double-sided foam pad having the adhesive layer, but is not limited thereto. In the first connection member 20 according to an embodiment of the present disclosure, the adhesive resin or the adhesive layer may include an acryl-based or urethane-based adhesive material, but are not limited thereto. For example, in the first connection member 20 according to an embodiment of the present disclosure, the adhesive resin or the adhesive layer may include a urethane-based adhesive material that has a relatively ductile characteristic rather unlike an acryl-based adhesive material having a characteristic that is relatively high in hardness, for preventing or minimizing the transfer of a vibration of the front member 10 to the supporting frame 70.

The supporting frame 70 according to an embodiment of the present disclosure may include a connection portion 71 and a supporting portion 73.

The connection portion (or connection part) 71 may be on the rear surface of the front member 10. For example, the connection portion 71 may be disposed at the rear periphery portion of the front member 10, and include an opening 70a to overlap the display panel 30. The connection portion 71 may be disposed at the rear surface of the front member 10 and may surround the side surfaces of the supporting member 50. For example, the connection portion 71 may be disposed at the rear periphery portion of the front member 10 using the first connection member 20 and may be supported by the front member 10 to surround the side surfaces of the supporting member 50.

The connection portion 71 may have the same shape as that of the front member 10. For example, the connection portion 71 may have a polygonal shape or a non-polygonal shape, which is the same as that of the front member 10. A total height (or thickness) of the connection portion 71 according to an embodiment of the present disclosure may be greater or higher than a total height of the supporting member 50.

Figure 11:
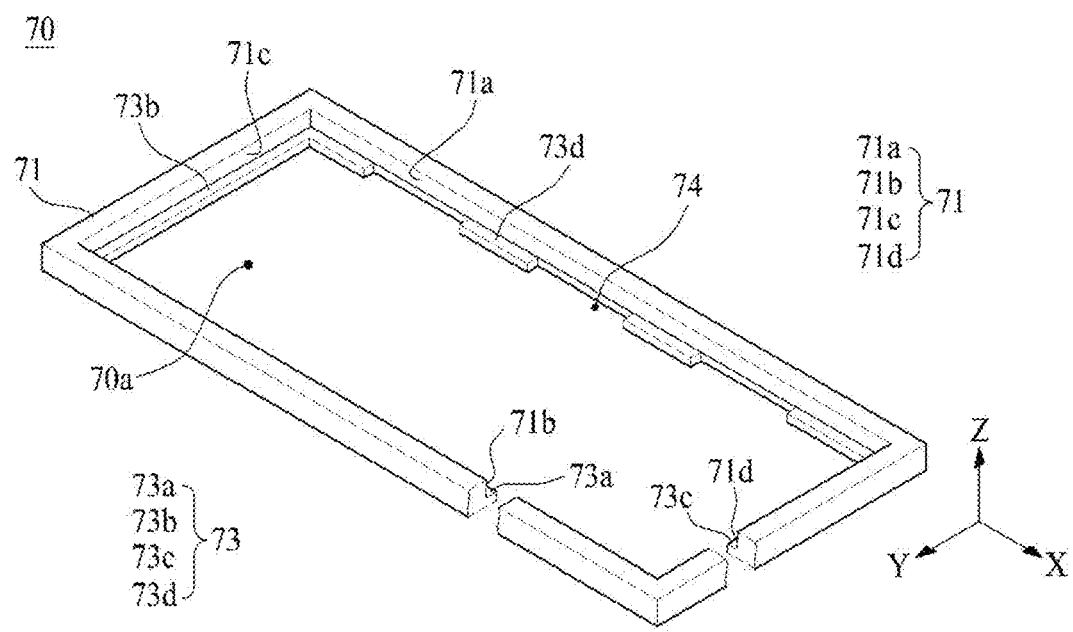
FIG. 11 illustrates a supporting frame illustrated in FIG. 10.

The connection portion 71 may include first to fourth inner surfaces 71a to 71d (shown in FIG. 11). The first to fourth inner surfaces 71a to 71d of the connection portion 71 may surround the side portion 53 of the supporting member 50.

The opening 70a of the connection portion 71 may be formed by the first to fourth inner surfaces 71a to 71d of the connection portion 71. The opening 70a of the connection portion 71 may accommodate the supporting member 50. The opening 70a of the connection portion 71 may have the same shape as that of the display panel 30 and may have a size that is greater than that of the display panel 30. The opening 70a of the connection portion 71 may have a polygonal shape or a non-polygonal shape, which is the same as that of the front member 10.

The supporting portion 73 may protrude from an inner surface of the connection portion 71 to the opening 70a and may support the supporting member 50. For example, the supporting portion 73 may support at least three surfaces among the rear periphery portion of the supporting member 50. The supporting portion 73 may be a "supporting part," a "propping portion," a "cover supporting portion," or a "cover propping portion," but the term is not limited thereto.

The supporting portion 73 according to an embodiment of the present disclosure may include first to third supporting portions 73a to 73c that protrude to the opening 70a of the connection portion 71 from the second to fourth inner surfaces 71b to 71d other than the first inner surface 71a parallel to a first periphery portion of the display panel 30 among the first to fourth inner surfaces 71a to 71d of the connection portion 71 configuring the opening 70a.

Each of the first to third supporting portions 73a to 73c (shown in FIG. 11) may include a stepped surface that is stepped from an uppermost surface of the connection portion 71. For example, a step height (or a height) between the stepped surface (or an upper surface) of each of the first to third supporting portions 73a to 73c and the uppermost surface of the connection portion 71 may be higher in height than the side portion 53 of the supporting member 50.

Each of the first to third supporting portions 73a to 73c according to an embodiment of the present disclosure may be disposed at the rear periphery portion of the supporting member 50. For example, each of the first to third supporting portions 73a to 73c may support the rear periphery portion of the supporting member 50. For example, the first to third supporting portions 73a to 73c may be respectively disposed at first to third rear periphery portions of the supporting member 50 by a second connection member (or a cover connection member) 60. Accordingly, the supporting member 50 may be accommodated or stored into the opening 70a of the supporting frame 70. For example, the supporting member 50 may be disposed in the supporting frame 70 by the second connection member 60 and may be accommodated or stored into the opening 70a of the supporting frame 70.

The second connection member 60 may include an adhesive resin, a double-sided tape having an adhesive layer, or a double-sided foam pad having the adhesive layer, but is not limited thereto. For example, the second connection member 60 may include the same adhesive resin, the double-sided tape, or the double-sided foam pad as those of the first connection member 20, but is not limited thereto.

With reference to FIGS. 2 to 5, the vibration generating module 90 may be disposed (or connected) between the supporting member 50 and the display panel 30. The vibration generating module 90 may be supported by the supporting member 50 and may vibrate the display panel 30. The vibration generating module 90 may vibrate according to a driving signal including a sound signal or a haptic feedback signal to directly vibrate the display panel 30, and thus, may output the sound DVS by the vibration of the display panel 30 or may generate a haptic feedback (or a haptic vibration) responding to a user touch.

The vibration generating module 90 may be implemented as a sound generating device including a coil (or a voice coil) and a magnet. The vibration generating module 90 according to an embodiment of the present disclosure may include a bobbin and a coil wound around the bobbin, and the bobbin may contact the rear surface of the display panel 30.

The vibration generating module 90 may include one sound generator or a plurality of sound generators, such as sound generators 90-1 and 90-2. The sound generators 90-1 and 90-2 may be disposed in or accommodated (or stored) into the accommodating portion 55 in the supporting member 50 and may vibrate the display panel 30. For example, the sound generators 90-1 and 90-2 may each include a bobbin and a coil wound around the bobbin, and the bobbin may contact the rear surface of the display panel 30.

The vibration generating module 90 according to an embodiment of the present disclosure may include a first sound generator 90-1 for vibrating the first rear surface of the display panel 30 and a second sound generator 90-2 for vibrating the second rear surface of the display panel 30.

The first sound generator 90-1 may be supported by or accommodated (or stored) into the first accommodating portion 55a in the supporting member 50, and may be on the first rear surface of the display panel 30. The first sound generator 90-1 may vibrate based on a first driving signal including a sound signal or a haptic feedback signal to directly vibrate the first rear surface of the display panel 30, and thus, may output a sound DVS by the vibration of the display panel 30 or may generate a haptic feedback (or a haptic vibration) responding to a user touch.

The second sound generator 90-2 may be supported by or accommodated (or stored) into the second accommodating portion 55b in the supporting member 50 and may be on the second rear surface of the display panel 30. The second sound generator 90-2 may vibrate based on a second driving signal including a sound signal or a haptic feedback signal to directly vibrate the second rear surface of the display panel 30, and thus, may generate a sound DVS by the vibration of the display panel 30.

The first driving signal and the second driving signal may be the same or differ. For example, the first driving signal may include a left sound signal or a first haptic feedback signal corresponding to a first region (or a left region) Al of the display panel 30. The second driving signal may include a right sound signal or a second haptic feedback signal corresponding to a second region (or a right region) A2 of the display panel 30.

Each of the first and second sound generators 90-1 and 90-2 may be a "vibration unit," an "actuator," an "exciter," or a "transducer," but the term is not limited thereto.

With reference to FIGS. 2 to 6, the display apparatus according to an embodiment of the present disclosure may further include a driving circuit 40 and a circuit protection portion 110.

The driving circuit 40 may be on the rear surface of the supporting member 50, and may be connected to the display panel 30. For example, the driving circuit 40 may be connected to a pad part 31d provided at the first periphery portion (or one periphery portion) of the display panel 30. The driving circuit 40 may be implemented to display an image on the plurality of pixels provided on the pixel array substrate 31 of the display panel 30. For example, an image may be displayed on the display area of the display panel 30. The driving circuit 40 may sense a user touch through the plurality of touch electrodes disposed on the touch electrode layer of the display panel 30.

The driving circuit 40 according to an embodiment of the present disclosure may include at least one flexible circuit film 41, at least one data driving integrated circuit (IC) 42, and a printed circuit board (PCB) 43. For example, the driving circuit 40 may include the at least one flexible circuit film 41, a plurality of data driving ICs 42, and a PCB 43.

The at least one flexible circuit film 41 may be connected to at least one pad parts 31d, provided at a first periphery portion (or one periphery portion) of the pixel array substrate 31 of the display panel 30, through a space between the side surface of the supporting member 50 and the supporting frame 70. The plurality of pad parts 31d may be arranged by certain intervals in the first direction X. Therefore, the at least one flexible circuit film 41 may be connected to the plurality of pad parts 31d arranged at certain intervals, and thus, may be arranged by certain intervals in the first direction X. For example, the at least one flexible circuit film 41 may be disposed in the pad part 31d in the display panel 30 through a film attaching process using an anisotropic conductive film.

The at least one flexible circuit film 41 may surround the rear surface of the supporting member 50. For example, the at least one flexible circuit film 41 may be bent (or folded) from the pad part 31d to the rear surface of the supporting member 50. For example, the other portion, except one portion, of the at least one flexible circuit film 41 may be bent (or folded) toward the rear surface of the supporting member 50 through a space between a side surface of the supporting member 50 and the supporting frame 70. Therefore, as illustrated in FIGS. 5 and 6, a bending portion (or a folding portion) of the at least one flexible circuit film 41 that is bent (or folded) from the pad part 31d in parallel with the side portion 53 of the supporting member 50 may be covered by the supporting frame 70 (for example, a first inner surface 71a of the connection portion 71), and thus, may be protected by the supporting frame 70 without being exposed at the outside of a side surface of the display apparatus.

The plurality of data driving ICs 42 may be respectively mounted on the at least one flexible circuit film 41 or may be respectively mounted on the plurality of flexible circuit films 41. Each of the plurality of data driving ICs 42 may be mounted on a corresponding flexible circuit film 41 through a chip bonding process or a surface mounting process. Each of the plurality of data driving ICs 42 may convert input digital pixel data into an analog data signal based on a data control signal and may supply the analog data signal to a corresponding pixel.

The PCB 43 may be connected to the at least one flexible circuit film 41 in common. The PCB 43 may be electrically connected to the other portion of the at least one flexible circuit film 41 through a film attaching process using an anisotropic conductive film and may be disposed at a first rear periphery portion of the supporting member 50, based on bending of the at least one flexible circuit film 41. For example, the PCB 43 may be disposed at the first rear periphery portion of the supporting member 50 by a first adhesive member such as a double-sided tape. The first rear periphery portion of the supporting member 50 may be a region of the rear surface of the supporting member 50 where the at least one flexible circuit film 41 and the PCB 43 are disposed. For example, the first rear periphery portion of the supporting member 50 may be referred to as one portion of the rear portion of the supporting member 50.

For example, when the display apparatus according to an embodiment of the present disclosure is applied to an automotive display apparatus having a size that is relatively less than that of a display apparatus for large-screen televisions (TVs), a size of the PCB 43 on the rear surface of the display panel 30 may correspond to about 20% to 30% of a size of the display panel 30, and the PCB 43 may be placed or disposed in a vibration region of the display panel 30 based on a vibration of the vibration generating module 90. Therefore, in a case where the PCB 43 is disposed to directly contact the rear surface of the display panel 30, as a vibration of the display panel 30 for a sound DVS is directly transferred to the PCB 43, the PCB 43 may be damaged or detachment between the PCB 43 and the flexible circuit film 41 may occur due to the vibration of shaking of the PCB 43, and the data driving IC 42 may be damaged due to the vibration of shaking of the flexible circuit film 41 caused by the vibration of shaking of the PCB 43. Therefore, in an embodiment of the present disclosure, the PCB 43 may be between the rear surface of the display panel 30 and the supporting member 50 so as not to directly contact the rear surface of the display panel 30, and thus, may prevent or minimize the transfer of the vibration of the display panel 30 to the PCB 43, thereby preventing or minimizing the damage of the PCB 43 caused by the vibration of the display panel 30 and preventing or minimizing detachment between the flexible circuit film 41 and the PCB 43 and the damage of the data driving IC 42.

The driving circuit 40 according to an embodiment of the present disclosure may include a control board 44, a signal transfer member 45, a timing control circuit 46, and a user connector 47.

The control board 44 may be connected to the PCB 43 through the signal transfer member 45. The control board 44 may be connected to a display host system (or a display driving system) through the user connector 47. The control board 44 may supply the timing control circuit 46 with a timing synchronization signal and video data each supplied from the display host system and may supply digital pixel data, output from the timing control circuit 46, to the data driving IC 42 through the signal transfer member 45, the PCB 43, and the flexible circuit film 41.

The control board 44 may further include a voltage generating circuit that generates various driving voltages needed for driving of the display apparatus.

The timing control circuit 46 may be mounted on the control board 44 and may receive the timing synchronization signal and the video data each supplied from the display host system through the user connector 47. For example, the timing synchronization signal may include a vertical synchronization signal, a horizontal synchronization signal, a data enable signal, and a main clock signal.

The timing control circuit 46 may generate a gate control signal for controlling a driving timing of a gate driving circuit and a data control signal for controlling a driving timing of each of the plurality of data driving ICs 42 based on the timing synchronization signal. For example, the gate control signal may include at least one gate start signal and a plurality of gate shift clocks. The data control signal may include a source start signal, a source shift clock, and a source output enable signal.

The timing control circuit 46 may be mounted on the PCB 43 instead of the control board 44. Also, the voltage generating circuit may be mounted on the PCB 43 instead of the control board 44. In this case, the control board 44 may be omitted.

The driving circuit 40 according to an embodiment of the present disclosure may further include a touch driving circuit connected to the touch electrode layer of the display panel 30.

The touch driving circuit may sense a user touch through each of the plurality of touch electrodes disposed on the touch electrode layer to generate touch raw data and may provide coordinate information about the user touch to the display host system based on the generated touch raw data.

The display host system may include a main board, various circuits mounted on the main board, various storage mediums, a peripheral device, a keyboard, and a power device. The various circuits mounted on the main board may include a central control circuit for processing various information, an image processing circuit for processing data according to control by the central control circuit, and a sound processing circuit for processing a sound according to control by the central control circuit. The display host system may process various information, generate the timing synchronization signal and the video data to provide the timing synchronization signal and the video data to the control board 44, and may generate a driving signal including a sound signal or a haptic feedback signal to provide the driving signal to the control board 44. For example, the sound signal may be synchronized with the video data, or may not be synchronized with the video data.

The display host system may execute an application program associated with touch coordinates corresponding to coordinate information about a user touch provided from the touch driving circuit, or may perform a user interface based on touch drawing of a user. Also, the display host system may generate a driving signal including a haptic feedback signal corresponding to the coordinate information about the user touch provided from the touch driving circuit.

The circuit protection portion 110 may be on the rear surface of the supporting member 50, and may be on a rear surface of the driving circuit 40. For example, the circuit protection portion 110 may be on the rear surface of the supporting member 50, and may cover (or overlay) the driving circuit 40 on the rear surface of the supporting member 50. The circuit protection portion 110 may protect the driving circuit 40 from an external impact, and may protect the driving circuit 40 from static electricity flowing from the outside to the driving circuit 40. For example, the circuit protection portion 110 may have a T-shape that covers (or overlays) the driving circuit 40 disposed on the rear surface of the supporting member 50, but the shape is not limited thereto.

The circuit protection portion 110 may be disposed in the supporting member 50 by a plurality of connection members 111, and thus, may cover (or overlay) the other portion of each of the plurality of flexible circuit films 41 on the rear surface of the supporting member 50, the PCB 43, the control board 44, and the signal transfer member 45 and may externally expose only the user connector 47 mounted on the control board 44. Each of the plurality of connection members 111 may be a screw, but is not limited thereto. The user connector 47 may be connected to the display host system through a user cable.

Therefore, because the driving circuit 40 is not disposed on the rear surface of the display panel 30, a contact between the driving circuit 40 and the display panel 30 may be prevented or minimized when the vibration generating module 90 vibrates. Therefore, a sound of the display panel 30 based on the vibration of the vibration generating module 90 may be enhanced. For example, the driving circuit 40 may be disposed on the rear surface (or back surface) of the supporting member 50, and the vibration generating module 90 may be supported by the supporting member 50 and the supporting frame 70. Thus, an influence of a vibration of the driving circuit 40 on the display panel 30 may be reduced when the vibration generating module 90 vibrates, thereby enhancing a sound of the display panel 30. Also, the driving circuit 40 and/or the circuit protection portion 110 may be disposed on the rear surface of the supporting member 50 without being directly disposed on the rear surface of the display panel 20, and thus, a vibration of the display panel 30 may not be hindered by the vibration generating module 90. Accordingly, a vibration region of the display panel 30 based on a vibration of the vibration generating module 90 may be enlarged to a whole region of the display panel 30, and thus, a reproduction band of a sound generated by a vibration of the display panel 30 may increase.

With reference to FIGS. 3 to 5, the display apparatus according to an embodiment of the present disclosure may further include a heat dissipation member 130.

The heat dissipation member 130 may be on the rear surface (or back surface) of the supporting member 50 overlapping the vibration generating module 90. The heat dissipation member 130 may dissipate heat that occurs in the vibration generating module 90 due to driving (or vibration) of the vibration generating module 90, thereby preventing or minimizing the damage of the vibration generating module 90 caused by heat. For example, the heat dissipation member 130 may include one of Al, Cu, Ag, and Mg or an alloy thereof or may include a stainless steel material, but is not limited thereto. The heat dissipation member 130 may be referred to as a "heat dissipation block" or a "heat sink."

The heat dissipation member 130 according to an embodiment of the present disclosure may include first and second heat dissipation members 131 and 133 respectively disposed on the first and second accommodating portions 55a and 55b.

The first heat dissipation member 131 may be on the rear surface of the supporting member 50. For example, the first heat dissipation member 131 may be on the rear surface of the supporting member 50 corresponding to the first accommodating portion 55a of the supporting member 50 using a plurality of first connection members. Each of the plurality of first connection members may be a screw or a bolt, but is not limited thereto. The first heat dissipation member 131 may have a size that is equal to or less than that of a bottom surface of the first accommodating portion 55a.

Each of the plurality of first connection members may be on (or coupled to) the bottom surface of the first accommodating portion 55a to pass through each corner portion of the first heat dissipation member 131. As another example, each of the plurality of first connection members may be on (or coupled to) the first sound generator 90-1 to pass through each corner portion of the first heat dissipation member 131 and the bottom surface of the first accommodating portion 55a, and thus, the first sound generator 90-1 and the first heat dissipation member 131 may be simultaneously on (or coupled to) the supporting member 50.

The second heat dissipation member 133 may be on the rear surface of the supporting member 50. For example, the second heat dissipation member 133 may be on the rear surface of the supporting member 50 corresponding to the second accommodating portion 55b of the supporting member 50 using a plurality of second connection members. Each of the plurality of second connection members may be a screw or a bolt, but is not limited thereto. The second heat dissipation member 133 may have a size that is equal to or less than that of a bottom surface of the second accommodating portion 55b.

Each of the plurality of second connection members may be disposed on (or coupled to) the bottom surface of the second accommodating portion 55b to pass through each corner portion of the second heat dissipation member 133. As another example, each of the plurality of second connection members may be on (or coupled to) the second sound generator 90-2 to pass through each corner portion of the second heat dissipation member 133 and the bottom surface of the second accommodating portion 55b, and thus, the second sound generator 90-2 and the second heat dissipation member 133 may be simultaneously on (or coupled to) the supporting member 50.

Therefore, the display apparatus according to an embodiment of the present disclosure may output a sound to a forward region in front of the display panel 30 using the display panel 30 as a vibration plate for generating a sound, thereby improving sound quality and increasing the immersion experience of a viewer. Also, in the display apparatus according to an embodiment of the present disclosure, because the driving circuit 40 is disposed on the rear surface of the supporting member 50, a sound may be output through a whole-region vibration of the display panel 30, thereby increasing a reproduction band of a sound generated by the vibration of the display panel 30. For example, the display apparatus according to an embodiment of the present disclosure may output a sound of 100 Hz to 20 kHz by the vibration of the display panel 30, and for example, may output a sound of 300 Hz to 20 kHz at a sound pressure level of 74 dB or more.

With reference to FIGS. 2 to 6, the display apparatus according to an embodiment of the present disclosure may further include a reinforcement portion 150.

The reinforcement portion 150 may be on the rear surface of the supporting frame 70 to reinforce stiffness of the supporting frame 70, and thus, may prevent or minimize distortion of the supporting frame 70 caused by a vibration of the vibration generating module 90, thereby preventing or minimizing a reduction in performance of a sound DVS caused by distortion of the supporting frame 70. For example, the reinforcement portion 150 may be disposed on the rear surface of the supporting frame 70 in parallel with a first lengthwise direction X of the supporting frame 70 or a second lengthwise direction Y intersecting the first lengthwise direction X.

The reinforcement portion 150 according to an embodiment of the present disclosure may be disposed at a rear periphery portion of the supporting frame 70. For example, the reinforcement portion 150 may include a plurality of reinforcement portions 151 and 153 that are disposed at the rear periphery portion of the supporting frame 70 in parallel with the first lengthwise direction X or the second lengthwise direction Y of the supporting frame 70. For example, the reinforcement portion 150 may include a first reinforcement portion 151 disposed at a first rear periphery portion of the supporting frame 70 parallel to the first lengthwise direction X or the second lengthwise direction Y of the supporting frame 70 and a second reinforcement portion 153 disposed at a second rear periphery portion of the supporting frame 70 in parallel with the first reinforcement portion 151. For example, when the supporting frame 70 has a long rectangular shape where a widthwise direction is longer than a lengthwise direction, each of the first reinforcement portion 151 and the second reinforcement portion 153 may be disposed at the rear periphery portion of the supporting frame 70 parallel to the widthwise direction (or the lengthwise direction) of the supporting frame 70. For example, when the supporting frame 70 has a square shape, each of the first reinforcement portion 151 and the second reinforcement portion 153 may be disposed at the rear periphery portion of the supporting frame 70 parallel to the widthwise direction (or the lengthwise direction) of the supporting frame 70.

Each of the first reinforcement portion 151 and the second reinforcement portion 153 may include a metal material. For example, each of the first reinforcement portion 151 and the second reinforcement portion 153 may have a bar shape including a protrusion portion or a stiffness reinforcement structure. However, the present disclosure is not limited thereto, and each of the first reinforcement portion 151 and the second reinforcement portion 153 may have a cross-sectional structure having a __-shape, a ⊥-shape, or a ⊥⊥-shape.

Each of the first and second reinforcement portions 151 and 153 may be disposed on (or connected to) the rear surface of the supporting frame 70. For example, each of the first and second reinforcement portions 151 and 153 may be coupled or connected to the rear surface of the supporting frame 70 by a plurality of third connection members 155. Each of the plurality of third connection members 155 may be a screw or a bolt, but is not limited thereto. Each of the plurality of third connection members 155 may be disposed on (or connected to) the rear surface of the supporting frame 70 to pass through one periphery portion and the other periphery portion of each of the first and second reinforcement portions 151 and 153 overlapping the rear surface of the supporting frame 70. Thus, each of the first and second reinforcement portions 151 and 153 may be disposed on (or connected to) the rear surface of the supporting frame 70.

The display apparatus according to an embodiment of the present disclosure may further include a stiff portion 170.

The stiff portion 170 may be disposed across a region from the first accommodating portion 55a to the second accommodating portion 55b each provided in the supporting member 50 to reinforce stiffness of the supporting member 50. The stiff portion 170 may act as a supporter that supports the vibration generating module 90, and thus, may help transfer a vibration of the vibration generating module 90 to the display panel 30. For example, in a case where only the supporting member 50 supports the vibration generating module 90, because a thickness of the rear cover 50 is relatively thinner than that of the front member 10, the vibration of the vibration generating module 90 may not normally be transferred to the display panel 30. Therefore, the stiff portion 170 may reinforce stiffness of the supporting member 50 to prevent or minimize distortion of the supporting member 50 caused by the vibration of the vibration generating module 90, and thus, the vibration of the vibration generating module 90 may be normally transferred to the display panel 30.

According to an embodiment of the present disclosure, one portion of the stiff portion 170 may be disposed at the first accommodating portion 55*a*. For example, the one portion of the stiff portion 170 may be disposed at the first accommodating portion 55*a* by a plurality of fourth connection members 171. Each of the plurality of fourth connection members 171 may be a screw or a bolt, but is not limited thereto. The other portion of the stiff portion 170 may be disposed at the second accommodating portion 55*b*. For example, the other portion of the stiff portion 170 may be disposed at the second accommodating portion 55*b* by a plurality of fifth connection members 173. Each of the plurality of fifth connection members 173 may be a screw or a bolt, but is not limited thereto. A middle portion between the one portion and the other portion of the stiff portion 170 may overlap the circuit protection portion 110.

According to another embodiment of the present disclosure, the one portion of the stiff portion 170 may be disposed on the rear surface of the supporting frame 70 and at the first accommodating portion 55*a*. For example, the one portion of the stiff portion 170 may be coupled or connected to the rear surface of the supporting frame 70 by the plurality of fourth connection members 171 and may be disposed at the first accommodating portion 55*a*. The other portion of the stiff portion 170 may be on the rear surface of the supporting frame 70 and at the second accommodating portion 55*b*. For example, the other portion of the stiff portion 170 may be coupled or connected to the rear surface of the supporting frame 70 by the plurality of fifth connection members 173 and may be disposed at the second accommodating portion 55*b*.

The stiff portion 170 according to an embodiment of the present disclosure may be between the first and second reinforcement portions 151 and 153 in parallel with each of the first and second reinforcement portions 151 and 153. The stiff portion 170 may have the same shape as that of the first reinforcement portion 151 or the second reinforcement portion 153. A width (or a vertical length) of the stiff portion 170 may be greater than that of the first reinforcement portion 151 or the second reinforcement portion 153. For example, a width (or a vertical length) of the stiff portion 170 may be the same as that of the first accommodating portion 55*a*.

The stiff portion 170 may be disposed in a separate mechanism (or structure) disposed on a rear surface of the display apparatus according to an embodiment of the present disclosure. The stiff portion 170 may act as a supporter that supports the vibration generating module 90 and may act as a prop that props the display apparatus using a separate mechanism (or structure).

The display apparatus according to an embodiment of the present disclosure may further include a heat dissipation member 130 between the stiff portion 170 and the accommodating portion 55 provided in the supporting member 50.

The heat dissipation member 130 may include a first heat dissipation member 131 between the first accommodating portion 55*a* and the stiff portion 170 and a second heat dissipation member 133 between the second accommodating portion 55*b* and the stiff portion 170. The first and second heat dissipation members 131 and 133 are as described above, and thus, their repetitive descriptions are omitted.

The one portion of the stiff portion 170 may be disposed at the first heat dissipation member 131. For example, the one portion of the stiff portion 170 may be disposed at the first heat dissipation member 131 by the plurality of fourth connection members 171. For example, each of the plurality of fourth connection members 171 may pass through the one portion of the stiff portion 170 and may be disposed at (or fastened to) the first heat dissipation member 131. As another example, some of the plurality of fourth connection members 171 may pass through the one portion of the stiff portion 170 and a corner portion of the first heat dissipation member 131 and may be disposed at (or fastened to) the supporting member 50, or may additionally pass through the supporting member 50 and may be disposed on (or fastened to) a rear surface of the first sound generator 90-1. The other of the plurality of fourth connection members 171 may pass through the one portion of the stiff portion 170 and may be disposed at (or fastened to) the first heat dissipation member 131.

The other portion of the stiff portion 170 may be disposed at the second heat dissipation member 133. For example, the other portion of the stiff portion 170 may be disposed at the second heat dissipation member 133 by the plurality of fifth connection members 173. For example, each of the plurality of fifth connection members 173 may pass through the other portion of the stiff portion 170 and may be disposed at (or fastened to) the second heat dissipation member 133. As another example, some of the plurality of fifth connection members 173 may pass through the other portion of the stiff portion 170 and a corner portion of the second heat dissipation member 133 and may be disposed at (or fastened to) the supporting member 50, or may additionally pass through the supporting member 50 and may be disposed on (or fastened to) a rear surface of the second sound generator 90-2. The other of the plurality of fifth connection members 173 may pass through the other portion of the stiff portion 170 and may be disposed at (or fastened to) the second heat dissipation member 133.

Therefore, in the display apparatus according to an embodiment of the present disclosure, the reinforcement portion 150 may reinforce stiffness of the supporting frame 70 and/or the stiff portion 170 may reinforce stiffness of the supporting member, and thus, distortion may be prevented or minimized, thereby enhancing the performance of a sound generated by a vibration of the display panel 30. For example, the display apparatus including the reinforcement portion 150 and/or the stiff portion 170 may output a sound of 100 Hz to 20 kHz by the vibration of the display panel 30, and for example, may output a sound of 250 Hz to 20 kHz at a sound pressure level of 74 dB or more.

With reference to FIGS. 3 and 4, the display apparatus according to an embodiment of the present disclosure may further include a partition 190.

The partition 190 according to an embodiment of the present disclosure may include at least one partition member 191 between the display panel 30 and the supporting member 50.

The at least one partition member 191 may be between the display panel 30 and the supporting member 50 and between the first rear surface and the second rear surface of the display panel 30. The at least one partition member 191 may spatially separate a first rear region A1 and a second rear region A2 of the display panel 30 to provide an air gap (or a vibration space) between the display panel 30 and the supporting member 50.

The at least one partition member 191 may separate a first sound (or a left sound) based on a first rear vibration of the display panel 30 and a second sound (or a right sound) based on a second rear vibration of the display panel 30. For example, the at least one partition member 191 may prevent a vibration, generated in a first region overlapping the first rear surface of the display panel 30 by a vibration of the first sound generator 90-1, from being transferred to a second region overlapping the second rear surface of the display panel 30, or may prevent a vibration, generated in a second region of the display panel 30 by a vibration of the second sound generator 90-2, from being transferred to the first region of the display panel 30. Therefore, the at least one partition member 191 may attenuate or absorb a vibration of the display panel 30 in a center of the display panel 30, and thus, may prevent a sound DVS generated in the first region from being transferred to the second region or may prevent a sound DVS generated in the second region from being transferred to the first region. The partition member 191 may be a "center partition," a "sound separation member," a "center enclosure," an "enclosure," a "center baffle," a "baffle," or a "partition wall," but the term is not limited thereto.

According to another embodiment of the present disclosure, the partition 190 may include first and second partition members that are disposed between the display panel 30 and the supporting member 50 to surround each of the first and second sound generators 90-1 and 90-2 in a circular shape or a polygonal shape.

The at least one partition member 191 according to an embodiment of the present disclosure may include polyurethane, polyolefin, a single-side tape, or a double-sided tape, but is not limited thereto and may include a material having elasticity that enables the partition member 191 to be compressed to a certain degree.

Therefore, the display apparatus including the partition 190 may enhance a sound output characteristic through sound separation by the partition 190 and may output a 2-channel stereo sound to a forward region FD in front of the display panel 30.

Figure 7:
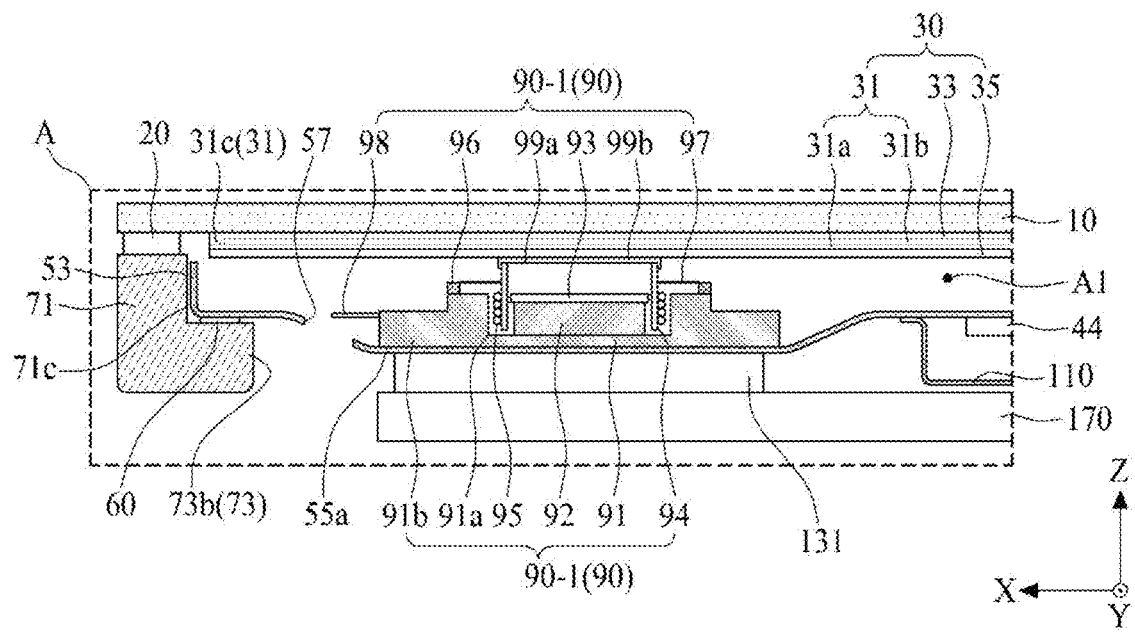
FIG. 7 is an enlarged view of a portion 'A' illustrated in FIG. 4.

FIG. 7 is an enlarged view of a portion 'A' illustrated in FIG. 4 and is a diagram for describing a first sound generator 90-1 of a vibration generating module 90 according to an embodiment of the present disclosure.

With reference to FIGS. 4 and 7, the first sound generator 90-1 of the vibration generating module 90 according to an embodiment of the present disclosure may be configured to vibrate the display panel 30 with a current of a driving signal including a sound signal or a haptic feedback signal each applied thereto based on Fleming's Left Hand Rule for Motors.

The first sound generator 90-1 according to an embodiment of the present disclosure may include a first plate 91, a magnet 92, a center pole 93, a bobbin 94, a coil 95, a second plate 96, a damper 97, and a terminal portion 98.

The first plate 91 may be disposed at the supporting member 50 and may be a main body of the first sound generator 90-1. The first plate 91 may support the magnet 92, the center pole 93, and the second plate 96. The first plate 91 may include a metal material having magnetism like iron (Fe). The first plate 91 may be a "base plate," a "lower plate," a "base frame," or a "yoke," but the term is not limited thereto.

The first plate 91 may include a groove portion 91a that accommodates the magnet 92 and the bobbin 94. For example, the groove portion 91a may be provided concavely from an upper surface of the first plate 91 to have a circular shape, but the shape is not limited thereto.

The first plate 91 according to an embodiment of the present disclosure may be on the bottom surface of the first accommodating portion 55a of the supporting member 50 using a fixing member such as an adhesive or a double-sided tape.

According to another embodiment of the present disclosure, as described above, the first plate 91 may be on the bottom surface of the first accommodating portion 55a of the supporting member 50 by the connection member 171 by which the reinforcement portion 150 or the stiff portion 170 is placed. In this case, the first plate 91 may include an extension portion 91b where the connection member 171 passing through the first accommodating portion 55a of the supporting member 50 is disposed.

The magnet 92, the center pole 93, the bobbin 94, and the coil 95 may each be referred to as a magnetic force circuit unit or a magnetic force vibration unit, which is disposed on the first plate 91 to vibrate the display panel 30.

The magnetic force circuit unit according to an embodiment of the present disclosure may have an external magnetic type structure or dynamic type structure including the magnet 92 disposed outward from the coil 95, or may have an internal magnetic type structure or micro type structure including the magnet 92 disposed inward from the coil 95. The first sound generator 90-1 including the magnetic force circuit unit having the internal magnetic type structure may have a wholly small size and a low leakage magnetic flux. The first sound generator 90-1 according to an embodiment of the present disclosure may have an external magnetic type or internal magnetic type structure. Hereinafter, an example where the first sound generator 90-1 has the internal magnetic type structure will be described.

The magnet 92 according to an embodiment of the present disclosure may be inserted or accommodated into the groove portion 91a of the first plate 91. The magnet 92 may be a permanent magnet having a cylindrical shape capable of being inserted or accommodated into the bobbin 94. According to an embodiment of the present disclosure, the magnet 92 may be implemented with a sintered magnet such as barium ferrite, and a material of the magnet 220 may include one or more of $Fe_2O_3$, $BaCO_3$, a neodymium magnet, strontium ferrite ($Fe_{12}O_{19}Sr$) with improved magnet component, an alloy cast magnet including Al, nickel (Ni), and cobalt (Co). However, the present disclosure is not limited thereto. For example, the neodymium magnet may be neodymium-iron-boron (Nd—Fe—B).

The bobbin 94 according to an embodiment of the present disclosure may be on the first plate 91 to surround the magnet 92. The bobbin 94 may have a circular shape or an oval shape, but is not limited thereto. The oval shape may have an elliptical shape, a rectangular shape with rounded corners, or non-circular curved shape having a width different from its height, but the present embodiment is not limited thereto. For example, in the bobbin 94 having the oval shape, a ratio of a long-axis diameter to a short-axis diameter may be set to 1.3:1 to 2:1. The bobbin 94 having the oval shape may improve a sound of a high sound band more than a circular shape, and may decrease the occurrence of heat caused by a vibration. Thus, such a bobbin 94 may have an excellent heat dissipation characteristic.

The coil 95 according to an embodiment of the present disclosure may be wound to surround an outer circumference surface of the bobbin 94 and may be supplied with a current (or a voice current) of a driving signal from the outside. The coil 95 may be lowered or raised along with the bobbin 94. The coil 95 may be referred to as a "voice coil," but the term is not limited thereto. When a current is applied to the coil 95, a whole portion of the bobbin 94 may vibrate upward and downward according to Fleming's Left Hand Rule for Motors based on an application magnetic field generated around the coil 95 and an external magnetic field generated around the magnet 92, and a sound DVS or a sound wave may be generated by a vibration of the display panel 30 caused by a vertical movement (or vibration) of the bobbin 94.

According to an embodiment of the present disclosure, as the coil 95 is wound to surround an outer circumference surface of the bobbin 94, heat occurring in the coil 95 may be transferred to the bobbin 94, and the coil 95 may include a material that has a relatively good heat dissipation characteristic, for decreasing an image quality defect affecting the display panel 30 due to the heat of the bobbin 94. Also, because the bobbin 94 vibrates upward and downward, a horizontal vibration may occur due to a vertical vibration, and a horizontal vibration of the bobbin 94 may be affected by a weight of the bobbin 94. A weight of the bobbin 94 may be affected by a weight of the coil 95, and thus, when a weight of the coil 95 is reduced, a horizontal vibration of the bobbin 94 may decrease. Therefore, considering heat transferred to the bobbin 94 and the horizontal vibration of the bobbin 94, the coil 95 may have a relatively good heat dissipation characteristic because thermal conductivity thereof is better than that of copper, which is a material of a general coil, and may include an Al material, which has a relatively good heat dissipation characteristic and is relatively lightweight compared to copper.

Moreover, in aluminum, because oxide is formed in air, welding may not be easy in manufacturing the first sound generator 90-1. Thus, the coil 95 according to an embodiment of the present disclosure may include an Al layer (or a first metal layer) for dissipating heat and a metal covering layer (or a second metal layer) surrounding the Al layer. The metal covering layer may include one of Cu, Ag, and gold (Au). For example, the coil 95 may be a copper clad aluminum wire by which copper is covered. The metal covering layer may be formed as a thin film type outside the first metal layer, and thus, may not greatly affect an increase in weight of the coil 95. Therefore, a weight of the coil 95 according to an embodiment of the present disclosure may decrease by about 60% compared to a coil including only Cu or a Cu wire.

According to an embodiment of the present disclosure, the bobbin 94 may include a structure including a material obtained by processing pulp or paper, Al or Mg or an alloy thereof, or synthetic resin such as polyimide. For example, the bobbin 94 may be implemented with a polyimide film that has a relatively good heat dissipation characteristic and has a relatively lightweight, for preventing an image quality defect of the display panel 30 caused by heat occurring in the coil 95.

The polyimide film may have physical properties that are not changed within a wide temperature range from −273° C. to 400° C. and may have a heat resistance, electrical insulation, flexibility, and discontinuity. Also, because the polyimide film has a good thermal and mechanical stiffness, the polyimide film may enhance the reliability of the bobbin 94, and the occurrence of heat caused by a vibration of the bobbin 94 may be reduced based on an excellent heat dissipation characteristic. For example, the polyimide film may be KAPTON and may be a condensation of pyromellitec dianhydride and 4,4'-oxydianiline, but is not limited thereto.

The center pole 93 may be accommodated or inserted into the bobbin 94 and may guide raising or lowering of the bobbin 94. For example, since the center pole 93 is accommodated or inserted into the bobbin 94, an outer circumference surface of the center pole 93 may be surrounded by the bobbin 94. The center pole 93 may be referred to as an "elevation guider" or "pole pieces," but the term is not limited thereto.

The second plate 96 may be disposed at a front periphery portion of the first plate 91 and may support the damper 97. The second plate 96 according to an embodiment of the present disclosure may be provided at the front periphery portion of the first plate 91 to have a certain height and the same shape as that of the bobbin 94. According to another embodiment of the present disclosure, the second plate 96 may include a hollow portion that is provided at the front periphery portion of the first plate 91 to have a certain height and the same shape as that of the bobbin 94. The second plate 96 may be referred to as an "edge plate," a "lower plate," a "frame," or a "yoke," but the term is not limited thereto.

The damper 97 may be between the second plate 96 and the magnetic force circuit unit. For example, the damper 97 may be between the second plate 96 and the bobbin 94. The damper 97 may be a "spider," a "suspension," or an "edge," but the term is not limited thereto.

One portion of the damper 97 according to an embodiment of the present disclosure may be connected to the second plate 96, and the other portion of the damper 97 may be connected to an upper outer surface of the bobbin 94. The damper 97 may be provided in a creased structure between the one portion and the other portion thereof and may be contracted and relaxed based on a vertical motion of the bobbin 94 to control a vibration of the bobbin 94. The damper 97 may be connected between the bobbin 94 and the second plate 96 and may limit a vibration distance of the bobbin 94 with a restoring force. For example, when the bobbin 94 vibrates by a certain distance or more or vibrates by a certain distance or less, the bobbin 94 may be restored to an original position by the restoring force of the damper 97.

Because the first sound generator 90-1 is between the display panel 30 and the supporting member 50, the first sound generator 90-1 should have a relatively thin thickness so as to thinly reduce a thickness of the display apparatus or slim the display apparatus. Due to this, when a height (or a thickness) of the bobbin 94 is reduced, a sound pressure level may be lowered. Therefore, to solve a problem where a sound pressure level is lowered due to a reduction in height of the bobbin 94, the first sound generator 90-1 may be configured in a structure where an area of the damper 97 disposed near the bobbin 94 is wide. In a case where an area of the damper 97 is enlarged, a space where a line for applying a current to the coil 95 is disposed may be narrowed, causing interference between the line and the damper 97. Therefore, the damper 97 may be formed of a conductor, and thus, may perform a function of the line.

The damper 97 according to an embodiment of the present disclosure may include a metal material electrically connected to the coil 95. For example, the damper 97 may be formed of stainless steel or Cu, but is not limited thereto.

The terminal portion 98 may include a pair of terminals that are disposed on one portion of the first plate 91 and are electrically connected to the damper 97. The terminal portion 98 may overlap the hole 57 in the first accommodating portion 55*a* of the supporting member 50 and may be exposed at the outside of the rear surface of the supporting member 50. The pair of terminals in the terminal portion 98 may be electrically connected to a driving signal cable passing through the hole 57 and may be supplied with a driving signal through the driving signal cable from the display host system.

The first sound generator 90-1 according to an embodiment of the present disclosure may further include a bobbin protection member 99*a*.

The bobbin protection member 99*a* may be disposed on a front surface (or a front end portion) of the bobbin 94 and may transfer a raising and lowering motion (or vibration) of the bobbin 94 to the rear surface of the display panel 30. The bobbin protection member 99*a* according to an embodiment of the present disclosure may have a ring shape disposed on the front surface of the bobbin 94, a disc shape covering the whole front surface of the bobbin 94, or a gap shape surrounding the front surface and the upper outer surface of the bobbin 94, but the shape is not limited thereto. For example, the bobbin protection member 99*a* may be a bobbin ring, but the term is not limited thereto.

The bobbin protection member 99*a* may be on the rear surface of the display panel 30 using an adhesive member. The adhesive member may be between the back plate 35 of the display panel 30 and the bobbin protection member 99*a*. The adhesive member according to an embodiment of the present disclosure may include an adhesive or a double-sided tape, but is not limited thereto.

The display apparatus according to an embodiment of the present disclosure may further include a blocking member 99*b* between the display panel 30 and the vibration generating module 90. The first sound generator 90-1 according to an embodiment of the present disclosure may further include the blocking member 99*b*.

The blocking member 99*b* (or a heat blocking member or a heat insulation member) may block or minimize the transfer of heat, occurring in the first sound generator 90-1 due to driving (or vibration) of the first sound generator 90-1, to the display panel 30, and thus, may prevent or minimize the local temperature increase of the display panel 30 caused by the heat occurring in the first sound generator 90-1, thereby preventing the image quality defect of the display panel 30 caused by a rapid temperature difference in a local region of the display panel 30 overlapping the first sound generator 90-1. For example, heat occurring in the coil 95 and the like of the first sound generator 90-1 may not be transferred to the display panel 30 by the blocking member 99*b* and may be diffused and dissipated through the supporting member 50 and the heat dissipation member 130 via the first plate 91, or may be diffused to the supporting member 50 and the heat dissipation member 130 through the first plate 91 and may be dissipated through the supporting member 50 and the heat dissipation member 130. The blocking member 99*b* may be configured to have a size that is equal or similar to that of the vibration generating module 90, but is not limited thereto. For example, the blocking member 99*b* may be configured to have a size that is equal or similar to that of the pixel array substrate 31.

For example, the blocking member 99*b* may have a film type or a plate type each including one of polyethylene, polyvinylpyrrolidone (PVP), polyethylene oxide (PEO), polyvinyl alcohol (PVA), polyvinyl acetate (PVAc), polylactic acid (PLA), polyamide (PA), polyester (PE), and polypropylene (PP), but is not limited thereto. As another example, the blocking member 99*b* may have a film type or a plate type each including one of rubber, silicon, fiber reinforced plastics, and composite resin including fiber reinforced plastics, but is not limited thereto. For example, the fiber reinforced plastics may include one of carbon fiber reinforced plastics, glass fiber reinforced plastics, and graphite fiber reinforced plastics or a combination thereof, but is not limited thereto.

The blocking member 99*b* according to an embodiment of the present disclosure may be between the rear surface of the display panel 30 and the front surface (or the front end portion) of the bobbin 94, and in this case, the bobbin protection member 99*a* may be omitted. For example, the blocking member 99*b* may be on the front surface (or the front end portion) of the bobbin 94 and may be disposed on or connected (or coupled) to the back plate 35 of the display panel 30 by an adhesive member.

According to another embodiment of the present disclosure, the blocking member 99*b* may be between the back plate 35 of the display panel 30 and the bobbin protection member 99*a*. For example, the blocking member 99*b* may be on a front surface of the bobbin protection member 99*a* and may be disposed on or connected (or coupled) to the back plate 35 of the display panel 30 by an adhesive member.

The second sound generator 90-2 of the vibration generating module 90 according to an embodiment of the present disclosure may include the same structure as that of the first sound generator 90-1, and thus, its repetitive description is omitted.

Figure 8:
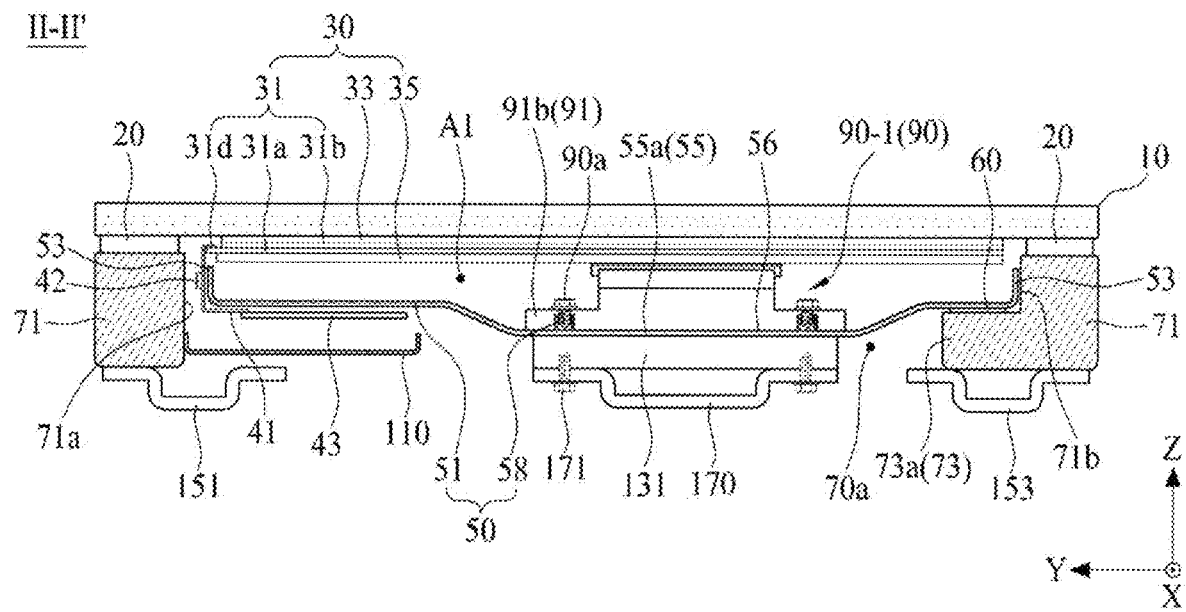
FIG. 8 is another cross-sectional view taken along line II-II' illustrated in FIG. 2.

FIG. 8 is another cross-sectional view taken along line II-II' illustrated in FIG. 2 and illustrates an example where a connection or coupling structure between a vibration generating module and a supporting member is modified. Hereinafter, descriptions of the same elements except a disposition or connection (or coupling) structure between a vibration generating module and a supporting member will be briefly given or are omitted.

With reference to FIG. 8, a first sound generator 90-1 of a vibration generating module 90 according to an embodiment of the present disclosure may be disposed at, supported by, or connected (or coupled) to a first accommodating portion 55*a* of a supporting member 50 by a connection member 90*a*.

The connection member 90*a* may be disposed on or connected to a bottom surface of the first accommodating portion 55*a* through an extension portion 91*b* of the first sound generator 90-1 based on an inner connection manner, and thus, the first sound generator 90-1 may be supported by or connected (or coupled) to the bottom surface of the first accommodating portion 55*a*. For example, the connection member 90*a* may be a screw or a bolt, but is not limited thereto.

The supporting member 50 may further include a boss portion 58 disposed on the bottom surface of the first accommodating portion 55*a*. The boss portion 58 may include a connection hole that is connected to the connection member 90*a* to protrude from the bottom surface of the first accommodating portion 55*a*. For example, the boss portion 58 may be inserted or accommodated into a boss groove provided in the extension portion 91*b* of the first sound generator 90-1.

The second sound generator 90-2 of the vibration generating module 90 according to an embodiment of the present disclosure, like the first sound generator 90-1, may be disposed on, supported by, or connected (or coupled) to a bottom surface of a second accommodating portion based on an inner connection manner using a connection member.

The vibration module 90 according to an embodiment of the present disclosure may be connected (or coupled) to the supporting member 50 based on an inner connection manner using the connection member 90*a* to increase a supporting force or a coupling force between the vibration generating module 90 and the supporting member 50, and when the vibration generating module 90 is being driven (or is vibrating), a noise caused by an undesired vibration between the vibration generating module 90 and the supporting member 50 may be prevented.

In the display apparatus according to an embodiment of the present disclosure, a thickness of the vibration generating module 90 may be reduced, and thus, the vibration generating module 90 may be provided between the display panel 30 and the supporting member 50, thereby decreasing a thickness of the display apparatus. Also, because the vibration generating module 90 is provided between the display panel 30 and the supporting member 50, a rear surface of the supporting member 50 may not need a hole where the vibration generating module 90 is disposed, thereby implementing the clean design of the display apparatus. Because the vibration generating module 90 is provided between the display panel 30 and the supporting member 50, the rear surface of the supporting member 50 may not need a hole where the vibration generating module 90 is disposed, thereby enhancing a degree of freedom based on a size or model of the display apparatus.

Figure 9:
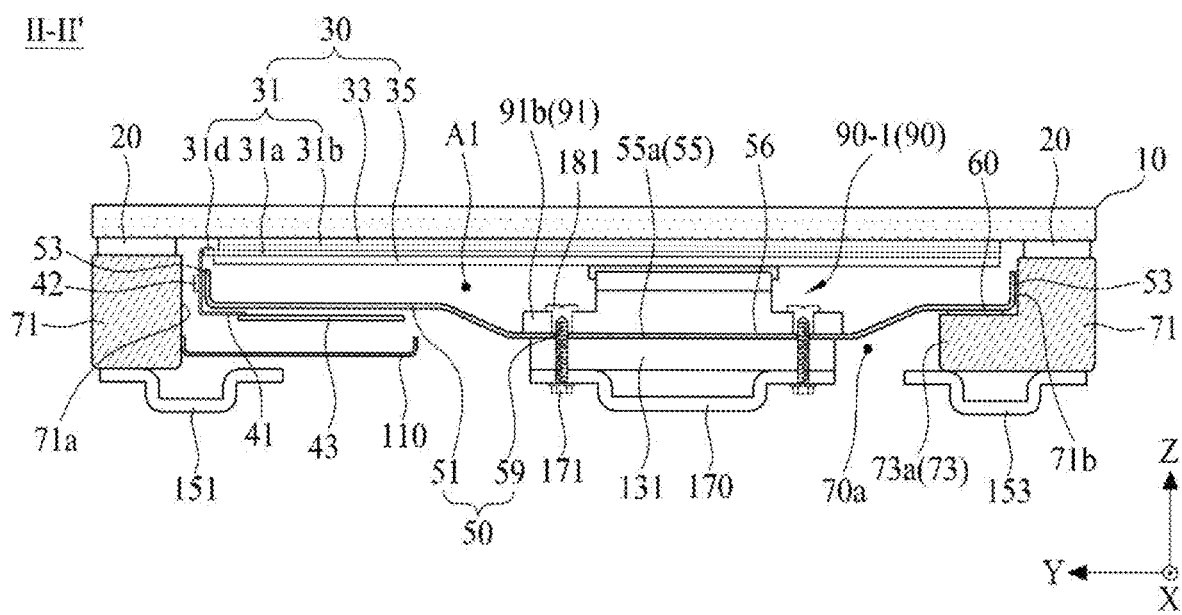
FIG. 9 is another cross-sectional view taken along line II-II' illustrated in FIG. 2.

FIG. 9 is another cross-sectional view taken along line II-II' illustrated in FIG. 2 and illustrates an example where a connection or coupling structure between a vibration generating module and a supporting member is modified. Hereinafter, descriptions of the same elements except a disposition or connection (or coupling) structure between a vibration generating module and a supporting member will be briefly given or are omitted.

With reference to FIG. 9, a first sound generator 90-1 of a vibration generating module 90 according to an embodiment of the present disclosure may be supported by or coupled to a first accommodating portion 55a of a supporting member 50 by a plurality of fourth connection members 171 that connect or couple a stiff portion 170 to a heat dissipation member 130 or a supporting member 50.

The display apparatus according to an embodiment of the present disclosure may further include a plurality of coupling members 181 connected to a corresponding fourth connection member 171 of the plurality of fourth connection members 171.

Each of the plurality of coupling members 181 may pass through an extension portion 91b of a first sound generator 90-1 and may be connected or coupled to a corresponding fourth connection member 171. For example, each of the plurality of coupling members 181 may be inserted or accommodated into a corresponding hole of a plurality of holes in the extension portion 91b of the first sound generator 90-1. Each of the plurality of coupling members 181 according to an embodiment may be a nut, such as a self-clinching nut (e.g., a PEM® nut) each including a head portion that is greater than a diameter of each of the holes, but is not limited thereto.

Each of the plurality of fourth connection members 171 may pass through the stiff portion 170, a first heat dissipation member 131, and a bottom surface of the first accommodating portion 55a and may be connected or fastened to a corresponding coupling member 181, and thus, the first sound generator 90-1 may be supported by or coupled to a bottom surface of the first accommodating portion 55a. Therefore, the first sound generator 90-1 may be disposed on, supported by, or coupled to the bottom surface of the first accommodating portion 55a based on a bidirectional connection manner using the fourth connection members 171 and the coupling members 181.

The supporting member 50 may further include a first hole 59 in the bottom surface of the first accommodating portion 55a. The first hole 59 may include a screw thread connected or fastened to the fourth connection member 171 or may have a hole type, but is not limited thereto.

A second sound generator 90-2 of the vibration generating module 90 according to an embodiment of the present disclosure, like the first sound generator 90-1, may be disposed on, supported by, or coupled to a bottom surface of a second accommodating portion using a bidirectional connection manner using a plurality of fifth connection members 173 and a coupling member.

In the display apparatus according to an embodiment of the present disclosure, the vibration generating module 90, the heat dissipation member 130, and the stiff portion 170 may be simultaneously connected or coupled to the supporting member 50 based on a bidirectional connection manner using a connection member and a coupling member, and thus, the number of elements may decrease. In the display apparatus according to an embodiment of the present disclosure, a supporting force or a coupling force between the vibration generating module 90 and the supporting member 50 may increase, and when the vibration generating module 90 is being driven (or is vibrating), a noise caused by an undesired vibration between the vibration generating module 90 and the supporting member 50 may be prevented.

Figure 10:
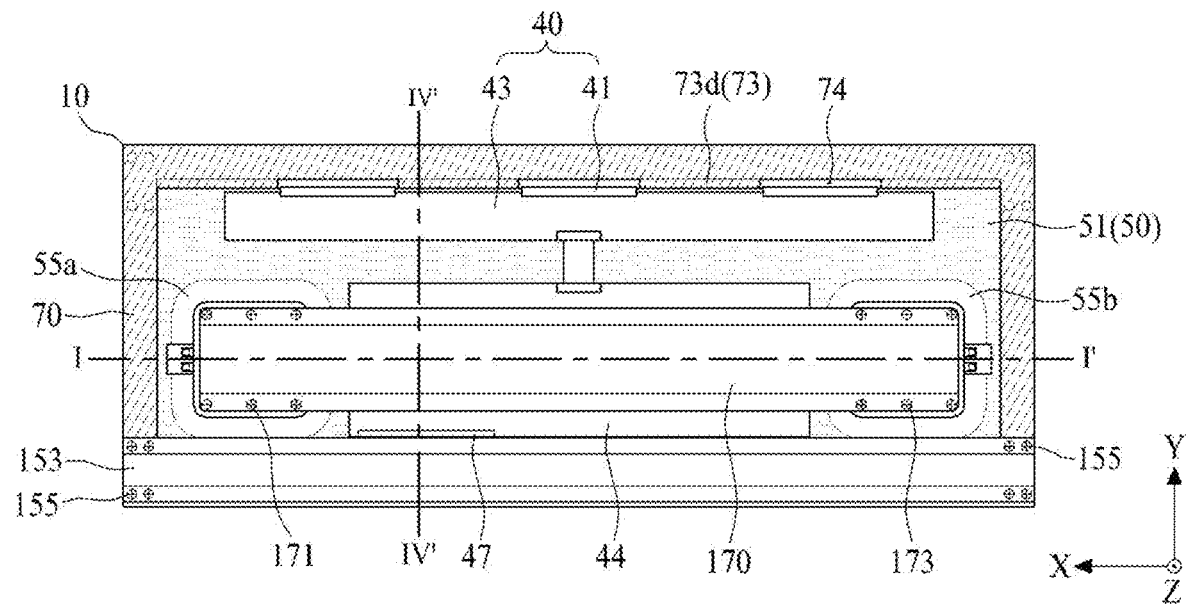
FIG. 10 illustrates a rear surface of a display apparatus according to another embodiment of the present disclosure.
Figure 12:
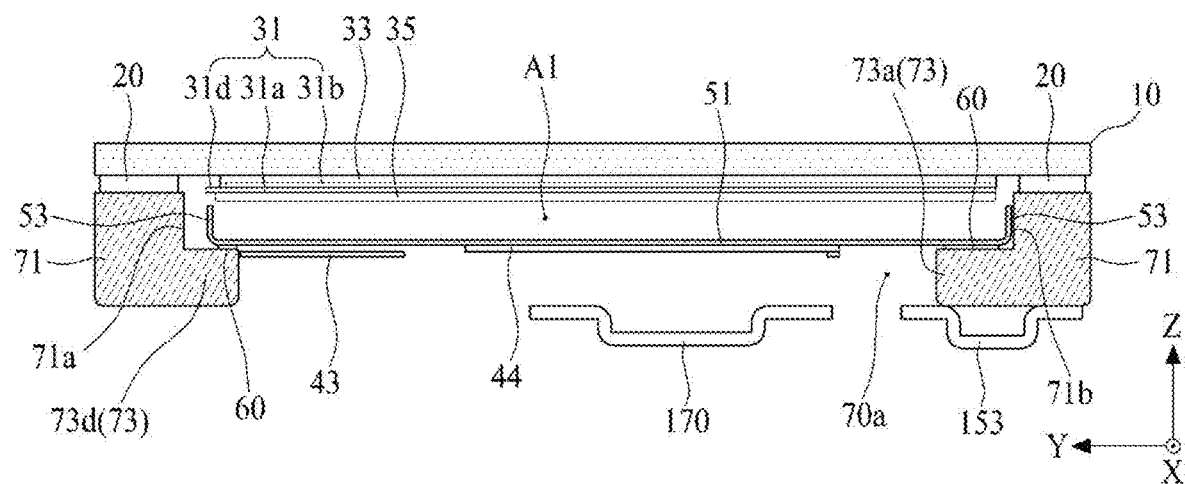
FIG. 12 is a cross-sectional view taken along line IV-IV' illustrated in FIG. 10.

FIG. 10 illustrates a rear surface of a display apparatus according to another embodiment of the present disclosure. FIG. 11 illustrates a supporting frame illustrated in FIG. 10. FIG. 12 is a cross-sectional view taken along line IV-IV' illustrated in FIG. 10. FIGS. 10 to 12 illustrate an example where a plurality of fourth supporting portions are added to a supporting frame. Hereinafter, descriptions of the same elements except a plurality of fourth supporting portions and relevant elements will be briefly given or are omitted.

With reference to FIGS. 10 to 12 in conjunction with FIG. 3, a supporting frame 70 according to another embodiment of the present disclosure may be disposed at a rear periphery portion of a front member 10 by a first connection member 20. The supporting frame 70 may include a four-surface supporting structure that surrounds side surfaces of the supporting member 50 and supports a rear periphery portion of the supporting member 50.

For example, the supporting frame 70 may include a connection portion 71 and a supporting portion 73.

The connection portion 71 may include an opening 70a that is disposed at the rear periphery portion of the front member 10 to overlap the display panel 30. The connection portion 71 may be disposed at (or coupled to) the rear periphery portion of the front member 10 using the first connection member 20 and may be supported by the front member 10 to surround the side surfaces of the supporting member 50. For example, the connection portion 71 may include first to fourth inner surfaces 71a to 71d. The first to fourth inner surfaces 71a to 71d of the connection portion 71 may surround a side portion 53 of the supporting member 50.

The supporting portion 73 may protrude from an inner surface of the connection portion 71 to the opening 70a, and may support the supporting member 50. For example, the supporting portion 73 may include a four-surface supporting structure that supports the rear periphery portion of the supporting member 50.

The supporting portion 73 according to an embodiment of the present disclosure may include first to third supporting portions 73a to 73c and a plurality of fourth supporting portions 73d.

The first to third supporting portions 73a to 73c, as illustrated in FIGS. 4 to 6, may protrude to the opening 70a of the connection portion 71 from the second to fourth inner surfaces 71b to 71d other than the first inner surface 71a parallel to a first periphery portion of the display panel 30 among the first to fourth inner surfaces 71a to 71d of the connection portion 71 configuring the opening 70a. The first to third supporting portions 73a to 73c may be respectively disposed at first to third rear periphery portions of the supporting member 50 by a second connection member (or a cover connection member) 60.

The plurality of fourth supporting portions 73d may protrude from the first inner surface 71a of the connection portion 71 to the opening 70a. Each of the plurality of fourth supporting portions 73d may protrude from the first inner surface 71a to the opening 70a to pass through a corresponding region between a plurality of flexible circuit films 41. Each of the plurality of fourth supporting portions 73d may support a fourth rear periphery portion of the supporting member 50 between the plurality of flexible circuit films 41 connected to the display panel 30. For example, each of the plurality of fourth supporting portions 73d may be disposed at (or connected to) the fourth rear periphery portion of the supporting member 50 by the second connection member (or the cover connection member) 60.

Each of the plurality of flexible circuit films 41 may be in a second hole (or a space) 74 between the plurality of fourth supporting portions 73d. The second hole 74 may be between the first inner surface 71a of the connection portion 71 and a side portion 53 of the supporting member 50. Therefore, each of the plurality of flexible circuit films 41 connected to a pad part of the display panel 30 may pass through the second hole 74 and may be bent (or folded) to a rear surface of the supporting member 50. The second hole 74 may be a "film passage portion" or a "passage portion," but the term is not limited thereto.

Therefore, the supporting frame 70 according to another embodiment of the present disclosure may support the first to fourth rear periphery portions of the supporting member 50 through the supporting portion 73 including the first to third supporting portions 73a to 73c and the plurality of fourth supporting portions 73d. Thus, stiffness of the supporting member 50 may be uniform. The supporting member 50 may be supported by the supporting portion 73 of the supporting frame 70 having the four-surface supporting structure, and thus, may have wholly uniform stiffness. A primary vibration mode performed based on a vibration of the vibration generating module 90 may be provided near the vibration generating module 90, and a vibration region of the vibration generating module 90 may match a maximum displacement position of the display panel 30, thereby enhancing the vibration efficiency of the vibration generating module 90 to enhance the quality and sound pressure level of a sound generated by a vibration of the display panel 30.

Figure 13:
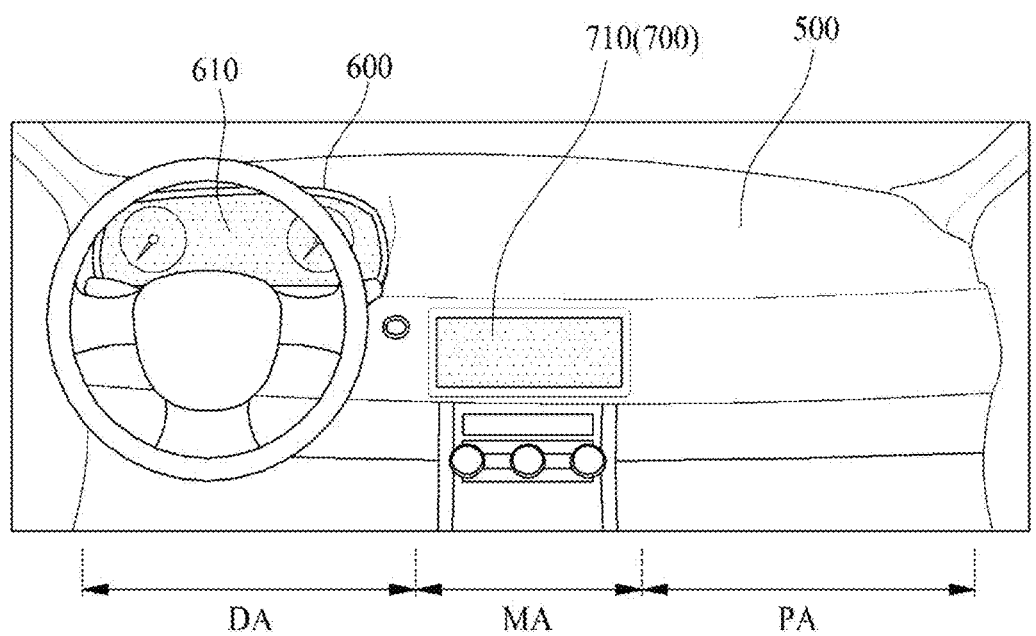
FIG. 13 illustrates a vehicle according to an embodiment of the present disclosure.

FIG. 13 illustrates a vehicle according to an embodiment of the present disclosure and illustrates an example where the display apparatus according to an embodiment of the present disclosure illustrated in FIGS. 1 to 12 is applied to the vehicle.

With reference to FIG. 13, the vehicle according to an embodiment of the present disclosure may include a dashboard 500, an instrument panel module 600, and an infotainment module 700.

The dashboard 500 may include a first region DA facing a driver seat or corresponding to the driver seat, a second region PA facing a passenger seat or corresponding to the passenger seat, and a third region MA between the first region DA and the second region PA.

The instrument panel module 600 may include a first display 610 in the first region DA of the dashboard 500. The instrument panel module 600 may be a "dashboard module" or an "instrument cluster," but the term is not limited thereto.

The first display 610 may provide a driver with various information such as vehicle state information and driving-related information such as the driving time, velocity, fuel amount, and revolutions per minute (RPM) of the vehicle.

The first display 610 may include the display apparatus according to an embodiment of the present disclosure illustrated in FIGS. 1 to 12, and thus, its repetitive description is omitted. Therefore, the first display 610 may display an image, corresponding to vehicle driving information provided from a vehicle host system, on a display panel. Also, the first display 610 may output, to the driver seat, a sound generated by a vibration of the display panel responding to a vibration of a vibration generating module based on a sound driving signal provided from the vehicle host system.

The infotainment module 700 (or an infotainment system) may include a second display 710 that is disposed in the third region MA (or a center fascia) of the dashboard 500.

The second display 710 may be connected to a navigation system and a vehicle convenience system such as an audio system, an air conditioning system, and a multimedia system each equipped in the vehicle and may display navigation information provided from the navigation system and a control icon for controlling a corresponding vehicle convenience system. Also, the second display 710 may provide a driver or a passenger with a sound corresponding to a sound signal provided from the audio system and/or the multimedia system.

The second display 710 may include the display apparatus according to an embodiment of the present disclosure illustrated in FIGS. 1 to 12, and thus, its repetitive description is omitted. Therefore, a display panel of the second display 710 may display navigation information provided from the navigation system and a control icon for controlling a corresponding vehicle convenience system. Also, the second display 710 may directly output a sound generated from the display panel that vibrates by a vibration of the vibration generating module based on a sound signal provided from the audio system and/or the multimedia system. Also, the second display 710 may sense a user touch through a touch electrode layer disposed in the display panel to perform an interface with a user.

The second display 710 may have a length that is enlarged toward the second region PA of the dashboard 500. For example, the second display 710 may be disposed across the third region MA and the second region PA of the dashboard 500.

Therefore, the vehicle according to an embodiment of the present disclosure may include the instrument panel module 600 including the first display 610 to which the display apparatus according to an embodiment of the present disclosure illustrated in FIGS. 1 to 12 is applied, and thus, may output a sound, generated by a vibration of the first display 610, to the head of a driver to directly transfer the sound to the driver's ears, thereby transferring a sound substantially similar to an original sound to the driver.

Moreover, the vehicle according to an embodiment of the present disclosure may include the infotainment module 700 including the second display 710 to which the display apparatus according to an embodiment of the present disclosure illustrated in FIGS. 1 to 12 is applied, and thus, may output a sound, generated by a vibration of the second display 710, to ears of the driver and/or a passenger, thereby transferring a sound substantially similar to an original sound to the driver and/or the passenger.

Moreover, the vehicle according to an embodiment of the present disclosure may use each of the first display 610 of the instrument panel module 600 and the second display 710 of the infotainment module 700 as a speaker for outputting a sound, and may transfer a 2-channel stereo sound to the driver and/or the passenger using a sound generated by a vibration of each of the first and second displays 610 and 710.

Figure 14:
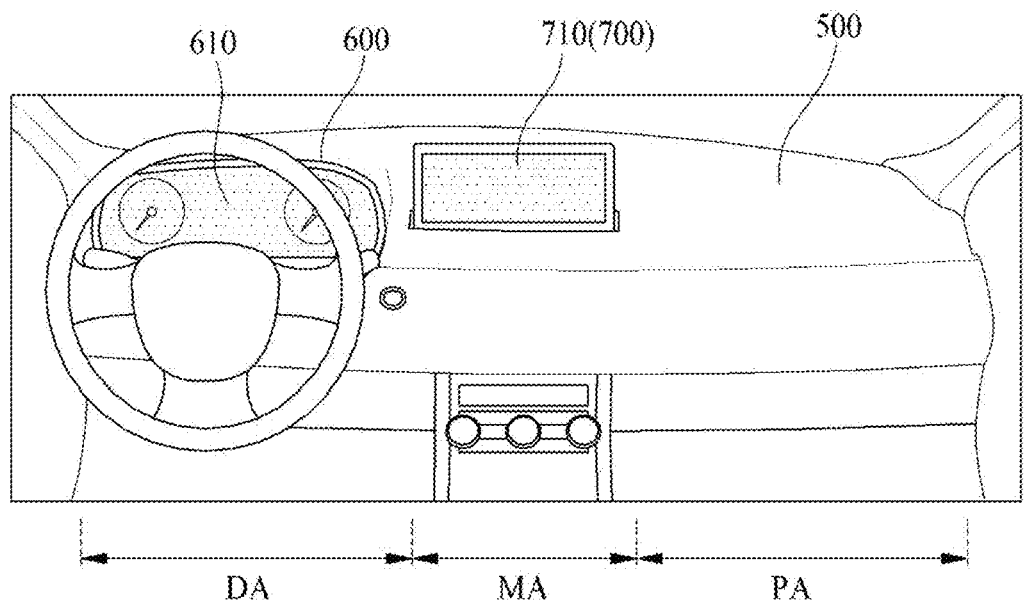
FIG. 14 illustrates a vehicle according to another embodiment of the present disclosure.

FIG. 14 illustrates a vehicle according to another embodiment of the present disclosure and illustrates an example where a structure of the infotainment module illustrated in FIG. 13 is modified. Hereinafter, descriptions of the same elements except an infotainment module and relevant elements will be briefly given or are omitted.

With reference to FIG. 14, an infotainment module 700 according to an embodiment of the present disclosure may be installed to be raised or lowered in a third region MA of a dashboard 500. The infotainment module 700 may be accommodated into the dashboard 500 based on the power-off of a vehicle or manipulation of a passenger and may be protruded from the inside of the dashboard 500 based on the power-on of the vehicle or manipulation of the passenger.

The infotainment module 700 according to an embodiment of the present disclosure may include a second display 710 and a display elevation unit.

The second display 710 is substantially the same as the second display illustrated in FIG. 13, and thus, its repetitive description is omitted.

The display elevation unit (or display lifting unit) may be in the third region MA of the dashboard 500, and may support the second display 710 so as to be raised or lowered. For example, the display elevation unit may raise the second display 710 to protrude the second display 710 from the inside of the dashboard 500, based on the power-on of the vehicle or manipulation of the passenger. Also, the display elevation unit may lower the second display 710 to accommodate or load the second display 710 into the dashboard 500, based on the power-off of the vehicle or manipulation of the passenger.

Therefore, the vehicle according to another embodiment of the present disclosure may have the same effect as that of the vehicle illustrated in FIG. 13.

Figure 15:
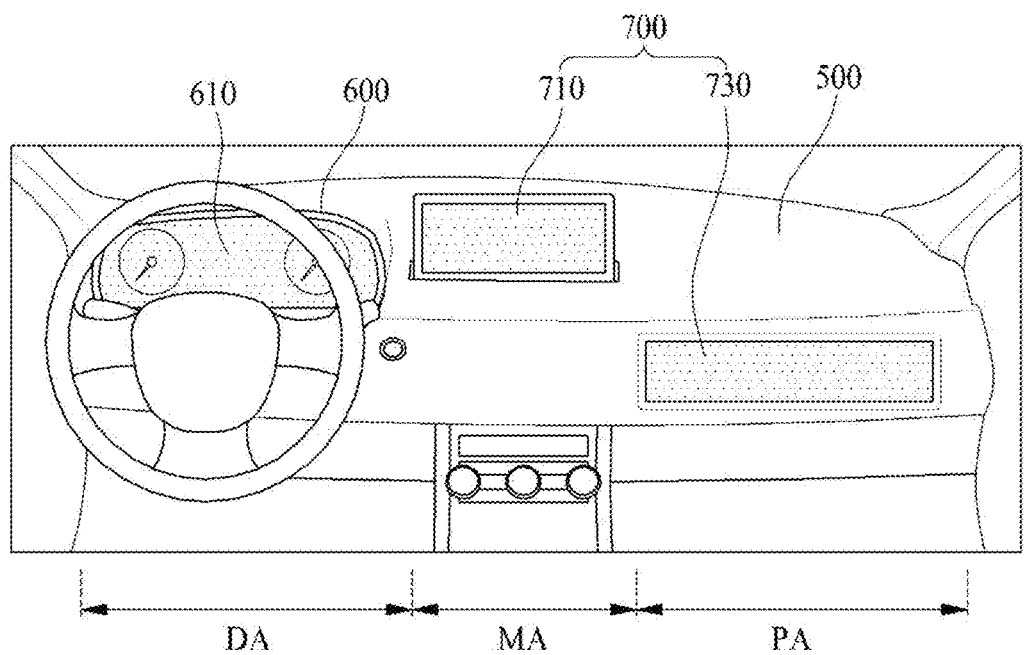
FIG. 15 illustrates a vehicle according to another embodiment of the present disclosure.

FIG. 15 illustrates a vehicle according to another embodiment of the present disclosure and illustrates an example where a structure of the infotainment module illustrated in FIG. 14 is modified. Hereinafter, descriptions of the same elements except an infotainment module and relevant elements will be briefly given or are omitted.

With reference to FIG. 15, an infotainment module 700 according to an embodiment of the present disclosure may include a second display 710 that is installed to be raised or lowered in a third region MA of a dashboard 500, a display elevation unit that raises or lowers the second display 710, and a third display 730 that is installed in a second region PA of the dashboard 500.

The second display 710 and the display elevation unit are substantially the same as the second display and the display elevation unit each illustrated in FIG. 14, and thus, their repetitive descriptions are omitted.

The third display 730 may share a function of the second display 710. For example, the third display 730 may be connected to a navigation system and a vehicle convenience system such as an audio system, an air conditioning system, and a multimedia system each equipped in the vehicle and may display navigation information provided from the navigation system and a control icon for controlling a corresponding vehicle convenience system. Also, the third display 730 may provide a passenger with a sound corresponding to a sound signal provided from the audio system and/or the multimedia system. Also, the third display 730 may transmit or receive image information or sound information through wireless communication with a wireless communication device of a passenger sitting on a passenger seat and may display the received image information on a display panel.

The third display 730 may include the display apparatus according to an embodiment of the present disclosure illustrated in FIGS. 1 to 12, and thus, its repetitive description is omitted.

The third display 730 may have a length that is enlarged toward the third region MA of the dashboard 500. For example, the third display 730 may be disposed across the second region PA and the third region MA of the dashboard 500.

A first display 610 of the instrument panel module 600 and the second and third displays 710 and 730 of the infotainment module 700 may each be used as a panel speaker for outputting a sound in the vehicle.

Therefore, the vehicle according to another embodiment of the present disclosure may have the same effect as that of the vehicle illustrated in FIG. 13 or FIG. 14. Also, the vehicle according to an embodiment of the present disclosure may use each of the first display 610 of the instrument panel module 600 and the second and third displays 710 and 730 of the infotainment module 700 as a speaker for outputting a sound, and may transfer a 3-channel stereo sound to a driver and/or a passenger using a sound generated by a vibration of each of the first to third displays 610, 710, and 730.

Figure 16:
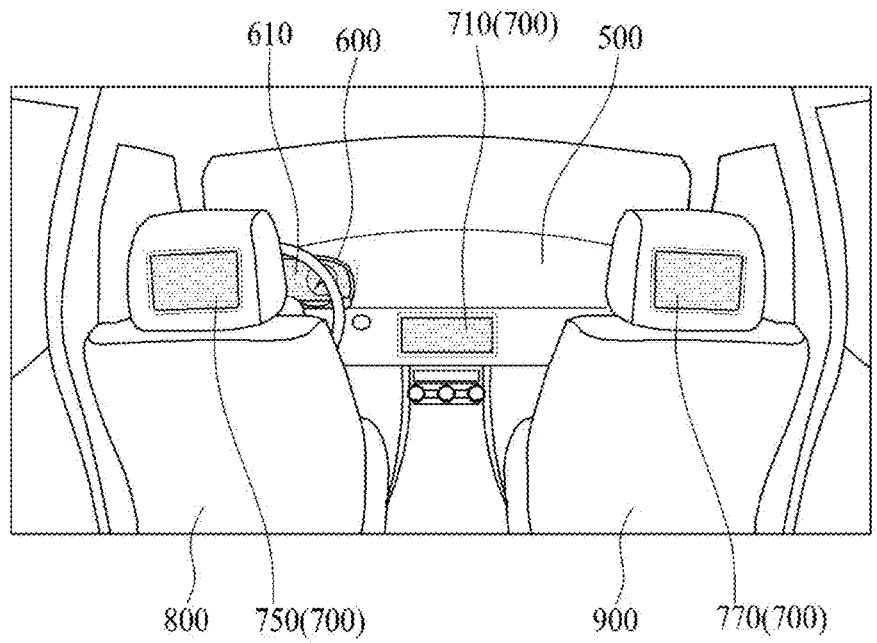
FIG. 16 illustrates a vehicle according to another embodiment of the present disclosure.

FIG. 16 illustrates a vehicle according to another embodiment of the present disclosure and illustrates an example where a structure of the infotainment module illustrated in FIG. 13 is modified. Hereinafter, descriptions of the same elements except an infotainment module and relevant elements will be briefly given or are omitted.

With reference to FIG. 16, an infotainment module 700 according to an embodiment of the present disclosure may further include a fourth display 750 disposed on a rear surface of a driver seat (or a driver seat sheet) 800 and a fifth display 770 disposed on a rear surface of a passenger seat (or a passenger seat sheet) 900.

The fourth display 750 may be disposed in or buried into a headrest of the driver seat 800, and the fifth display 770 may be disposed in or buried into a headrest of the passenger seat 900.

Each of the fourth and fifth displays 750 and 770 may include the display apparatus according to an embodiment of the present disclosure illustrated in FIGS. 1 to 12, and thus, their repetitive descriptions are omitted.

Each of the fourth and fifth displays 750 and 770 may share a function of the second display 710. Also, each of the fourth and fifth displays 750 and 770 may transmit or receive image information or sound information through wireless communication with a wireless communication device of a passenger sitting on a backseat and may display the received image information on a display panel.

A first display 610 of instrument panel module 600 and the second, fourth, and fifth displays 710, 750, and 770 of the infotainment module 700 may each be used as a panel speaker for outputting a sound in the vehicle.

Therefore, the vehicle according to another embodiment of the present disclosure may have the same effect as that of the vehicle illustrated in FIG. 13. Also, the vehicle according to an embodiment of the present disclosure may use each of the first display 610 of the instrument panel module 600 and the second, fourth, and fifth displays 710, 750, and 770 of the infotainment module 700 as a speaker for outputting a sound, and may transfer a 4-channel stereo sound to a driver and/or a passenger using a sound generated by a vibration of each of the first, second, fourth, and fifth displays 610, 710, 750, and 770.

As another example, in the vehicle according to an embodiment of the present disclosure, as illustrated in FIG. 14, the second display 710 of the infotainment module 700 may be installed in a third region MA of a dashboard 500 so as to be raised or lowered. Also, the infotainment module 700 may further include the third display 730 illustrated in FIG. 15. In this case, the vehicle according to an embodiment of the present disclosure may use at least one of the first display 610 of the instrument panel module 600 and the second to fifth displays 710, 730, 750, and 770 of the infotainment module 700 as a speaker for outputting a sound, and may transfer a sound, generated by a vibration of a display panel included in at least one of the first to fifth displays 610, 710, 730, 750, and 770, to a driver and/or a passenger.

Figure 17:
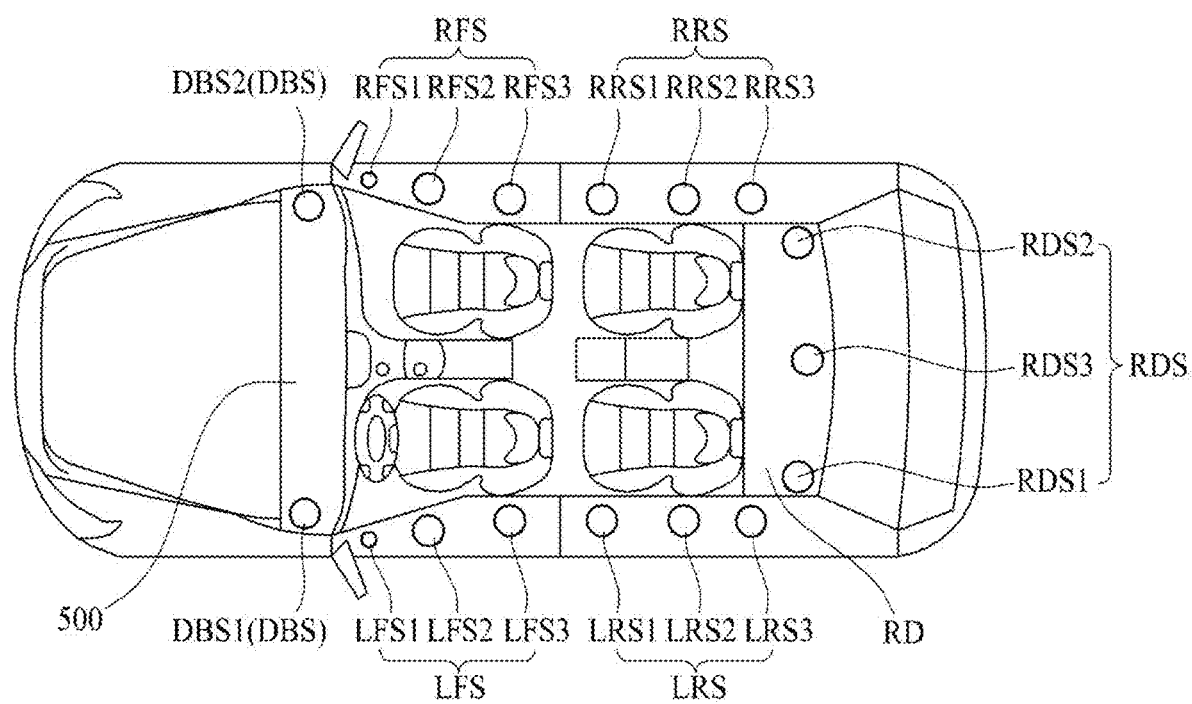
FIG. 17 illustrates a vehicle according to another embodiment of the present disclosure.

FIG. 17 illustrates a vehicle according to another embodiment of the present disclosure and illustrates an example where a speaker is added to the vehicle illustrated in one of FIGS. 13 to 16. Hereinafter, descriptions of the same elements except a separate speaker and relevant elements will be briefly given or are omitted.

Because reverberation is severe in a vehicle and there are many curves with which sound waves collide, there is a problem where it may be difficult to output a desired sound. Therefore, in a case where a display apparatus according to an embodiment of the present disclosure is provided in a vehicle or a vehicle body, a speaker installed in the vehicle may be implemented to have a small size, and a sound output from the vehicle may be enhanced.

With reference to FIG. 17, the vehicle according to another embodiment of the present disclosure may further include at least one of a dashboard speaker DBS, a left front door speaker LFS, a right front door speaker RFS, a left rear door speaker LRS, a right rear door speaker RRS, and a rear deco speaker RDS.

The dashboard speaker DBS may include at least one of a first dashboard speaker DBS1 disposed at a left edge or periphery of a dashboard 500 and a second dashboard speaker DBS2 disposed at a right edge or periphery of the dashboard 500. For example, each of the first dashboard speaker DBS1 and the second dashboard speaker DBS2 may be a speaker that outputs a sound of 150 Hz to 20 kHz having a mid-range or a full-range sound.

The left front door speaker LFS may include at least one of first to third left front speakers LFS1 to LFS3.

The first left front speaker LFS1 may be disposed at a first portion of a left front door adjacent to the dashboard 500. The second left front speaker LFS2 may be disposed at a middle portion of the left front door. The third left front speaker LFS3 may be disposed at a second portion of the left front door adjacent to a left rear door. For example, the first left front speaker LFS1 may be a display panel speaker implemented with the display apparatus illustrated in FIGS. 1 to 12. In this case, the left front speaker may output a sound based on a vibration of the display panel and may act as a left side mirror that displays an image from a left rear camera disposed on a left surface of the vehicle.

The right front door speaker RFS may include at least one of first to third right front speakers RFS1 to RFS3.

The first right front speaker RFS1 may be disposed at a first portion of a right front door adjacent to the dashboard 500. The second right front speaker RFS2 may be disposed at a middle portion of the right front door. The third right front speaker RFS3 may be disposed at a second portion of the right front door adjacent to a right rear door. For example, the first right front speaker RFS1 may be a display panel speaker implemented with the display apparatus illustrated in FIGS. 1 to 12. In this case, the right front speaker may output a sound based on a vibration of the display panel and may act as a right side mirror that displays an image from a right rear camera disposed on a right surface of the vehicle.

Each of the first left front speaker LFS1 and the first right front speaker RFS1 may be a speaker that outputs a sound of 150 Hz to 20 kHz having the mid-range or the full-range. Sounds output from the first left front speaker LFS1 and the first right front speaker RFS1 may be combined and output.

Each of the second left front speaker LFS2 and the second right front speaker RFS2 may be a tweeter, or may be a speaker that outputs a sound of 2 kHz to 20 kHz. Sounds output from the first and second left front speakers LFS1 and LFS2 and the first and second right front speakers RFS1 and RFS2 may be combined and output.

Each of the third left front speaker LFS3 and the third right front speaker RFS3 may be one of a woofer, a mid-woofer, and a sub-woofer, or may be a speaker that outputs a sound of 150 Hz to 20 kHz having the mid-range or the full-range sound. Sounds output from the third left front speaker LFS3 and the third right front speaker RFS3 may be combined and output.

The left rear door speaker LRS may include at least one of first to third left rear speakers LRS1 to LRS3.

The first left rear speaker LRS1 may be disposed at a first portion of a left rear door adjacent to the left front door. The second left rear speaker LRS2 may be disposed at a middle portion of the left rear door. The third left rear speaker LRS3 may be disposed at a second portion of the left rear door adjacent to a rear deco RD.

The right rear door speaker RRS may include at least one of first to third right rear speakers RRS1 to RRS3.

The first right rear speaker RRS1 may be disposed at a first portion of a right rear door adjacent to the right front door. The second right rear speaker RRS2 may be disposed at a middle portion of the right rear door. The third right rear speaker RRS3 may be disposed at a second portion of the right rear door adjacent to the rear deco RD.

Each of the first left rear speaker LRS1 and the first right rear speaker RRS1 may be a tweeter, or may be a speaker that outputs a sound of 2 kHz to 20 kHz. Sounds output from the first left rear speaker LRS1 and the first right rear speaker RRS1 may be combined and output.

Each of the second left rear speaker LRS2 and the second right rear speaker RRS2 may be a speaker that outputs a sound of 150 Hz to 20 kHz having the mid-range or the full-range sound. Sounds output from the first and second left rear speakers LRS1 and LRS2 and the first and second right rear speakers RRS1 and RRS2 may be combined and output.

Each of the third left rear speaker LRS3 and the third right rear speaker RRS3 may be one of a woofer, a mid-woofer, and a sub-woofer, or may be a speaker that outputs a sound of 150 Hz to 20 kHz having the mid-range or the full-range sound. Sounds output from the third left rear speaker LRS3 and the third right rear speaker RRS3 may be combined and output.

The rear deco speaker RDS may include at least one of a first rear deco speaker RDS1 disposed at a left edge or periphery of the rear deco RD, a second rear deco speaker RDS2 disposed at a right edge or periphery of the rear deco RD, and a third rear deco speaker RDS3 disposed at a middle portion of the rear deco RD.

Each of the first rear deco speaker RDS1 and the second rear deco speaker RDS2 may be a speaker that outputs a sound of 150 Hz to 20 kHz having the mid-range or the full-range sound.

The third rear deco speaker RDS3 may be one of a woofer, a mid-woofer, and a sub-woofer, or may be a speaker that outputs a sound of 60 Hz to 150 Hz, or may be at least one tweeter, or may be a speaker that outputs a sound of 2 kHz to 20 kHz.

A speaker on the left and a speaker on the right may be provided to be symmetrical with respect to a direction toward a front window of a vehicle. For example, a frequency of a sound output from a speaker disposed on an internal left side of a vehicle may be one or more of 150 Hz to 20 kHz and 2 kHz to 20 kHz, and a frequency of a sound output from a sound generating device disposed on an internal right side of the vehicle may be one or more of 150 Hz to 20 kHz and 2 kHz to 20 kHz. When a speaker is configured as described above, localization of a sound output from each of an internal left side and an internal right side of a vehicle may be enhanced.

Therefore, the vehicle according to another embodiment of the present disclosure may use at least one of the first display 610 of the instrument panel module 600 and the second to fifth displays 710, 730, 750, and 770 of the infotainment module 700 as a speaker for outputting a sound, may output a sound generated by a vibration of a display panel included in at least one of the first to fifth displays 610, 710, 730, 750, and 770, and may output a sound through at least one speaker disposed in at least one of the dashboard 500, the rear deco RD, the left door, and the right door, thereby providing a multichannel surround stereo sound to a driver and/or a passenger.

Figure 18:
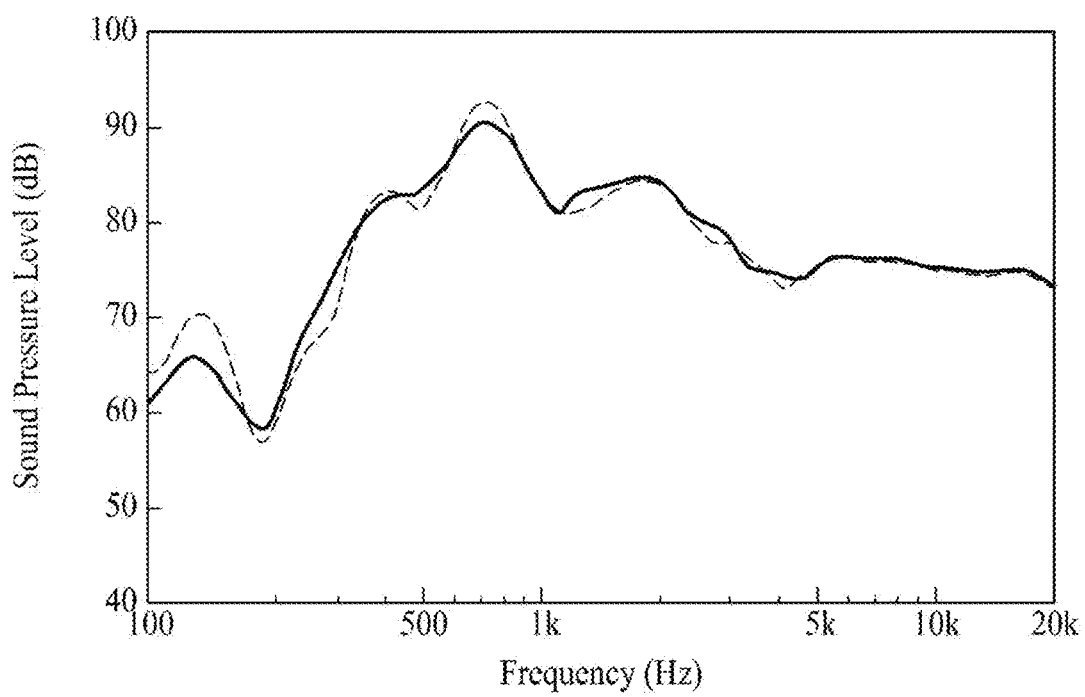
FIG. 18 is a graph showing an experimental result obtained by measuring a sound pressure characteristic of a display apparatus according to an embodiment of the present disclosure.

FIG. 18 is a graph showing an experimental result obtained by measuring a sound pressure characteristic of a display apparatus according to an embodiment of the present disclosure. In FIG. 18, Audio Precision company's APX525 has been used for measuring a sound pressure level, sine sweep has been applied at 100 Hz to 20 kHz, and the sound pressure level has been measured at a position spaced apart from a display panel by 1 m. The sine sweep may be a method of performing sweep for a short time, but is not limited thereto. In FIG. 18, the abscissa axis (x-axis) represents a frequency in hertz (Hz), and the ordinate axis (y-axis) represents a sound pressure level (SPL) in decibel (dB).

A first embodiment (a dotted line) of the present disclosure corresponds to a display apparatus where the reinforcement portion and the stiff portion of the display apparatus illustrated in FIG. 3 are not provided, and a second embodiment (a thick solid line) of the present disclosure corresponds a display apparatus where the reinforcement portion and the stiff portion of the display apparatus illustrated in FIG. 3 are provided.

As seen in FIG. 18, it may be seen that the display apparatus according to the first embodiment (the dotted line) of the present disclosure and the display apparatus according to the second embodiment (the thick solid line) of the present disclosure output a sound of 100 Hz to 20 kHz having a sound pressure level of 50 dB or more. Accordingly, even without a separate speaker, the display apparatus according to an embodiment of the present disclosure may vibrate the display panel to output a sound having a range from 100 Hz to 20 kHz.

A sound pressure level of a sound decreases in proportion to the square root of a distance. Considering that a sound pressure level of a voice of a person speaking at a position spaced apart from a listener by 0.5 m is about 60 dB, a sound pressure level that enables a listener spaced apart from a display apparatus by about 2 m to easily listen to a sound output from the display apparatus should satisfy about 72 dB to 75 dB.

With respect to a sound pressure level of 74 dB, the display apparatus according to the first embodiment (the dotted line) of the present disclosure may provide a sound of 300 Hz to 20 kHz to a listener spaced apart from the display apparatus by about 2 m, and the display apparatus according to the second embodiment (the thick solid line) of the present disclosure may provide a sound of 250 Hz to 20 kHz to a listener spaced apart from the display apparatus by about 2 m.

The display apparatus according to an embodiment of the present disclosure may be applied to various applications that output sound based on a vibration of a display panel. The display apparatus according to an embodiment of the present disclosure may be applied to mobile apparatuses, video phones, smart watches, watch phones, wearable apparatuses, foldable apparatuses, rollable apparatuses, bendable apparatuses, flexible apparatuses, curved apparatuses, portable multimedia players (PMPs), personal digital assistants (PDAs), electronic organizers, desktop personal computers (PCs), laptop PCs, netbook computers, workstations, navigation apparatuses, automotive navigation apparatuses, automotive display apparatuses, TVs, wallpaper display apparatuses, signage apparatuses, game machines, notebook computers, monitors, cameras, camcorders, home appliances, etc. Also, the flexible vibration module according to an embodiment of the present disclosure may be applied to organic light-emitting lighting apparatuses or inorganic light-emitting lighting apparatuses. Furthermore, when the flexible vibration module according to the present disclosure is applied to a mobile apparatus, the flexible vibration module may act as a speaker or a receiver.

A display apparatus and a vehicle including the same according to an embodiment of the present disclosure will be described below.

A display apparatus according to an embodiment of the present disclosure includes a display panel configured to display an image; a front member on a front surface of the display panel; a supporting member on a rear surface of the display panel; a supporting frame on a rear surface of the front member, the supporting frame configured to surround a side surface of the supporting member and support the supporting member; and a vibration generating module supported by the supporting member and configured to vibrate the display panel.

According to some embodiments of the present disclosure, the display apparatus further includes a driving circuit on a rear surface of the supporting member and including a flexible circuit film, wherein the flexible circuit film is connected to the display panel.

According to some embodiments of the present disclosure, the supporting frame includes a connection portion at a rear periphery portion of the front member, the connection portion including an opening overlapping the display panel;

and a supporting portion protruding from an inner surface of the connection portion to the opening.

According to some embodiments of the present disclosure, the display apparatus further includes a pad part at one periphery portion of the display panel; and a driving circuit on a rear surface of the supporting member and connected to the pad part, wherein the supporting portion includes first to third supporting portions protruding from second to fourth inner surfaces of the connection portion to the opening, but not protruding from a first inner surface of the connection portion parallel to the one periphery portion of the display panel.

According to some embodiments of the present disclosure, the display apparatus further includes a pad part at one periphery portion of the display panel; and a driving circuit on a rear surface of the supporting member and connected to the pad part, wherein the supporting portion includes first to third supporting portions protruding from second to fourth inner surfaces of the connection portion to the opening, but not protruding from a first inner surface of the connection portion parallel to the one periphery portion of the display panel; and a plurality of fourth supporting portions protruding from the first inner surface of the connection portion to the opening.

According to some embodiments of the present disclosure, the driving circuit includes a plurality of flexible circuit films connected to the pad part; and each of the plurality of fourth supporting portions supports a rear periphery portion of the supporting member between the plurality of flexible circuit films.

According to some embodiments of the present disclosure, the display apparatus further includes a driving circuit on a rear surface of the supporting member and connected to the display panel; and a circuit protection portion that covers a rear surface of the driving circuit.

According to some embodiments of the present disclosure, the display apparatus further includes a plurality of reinforcement portions in parallel with a first lengthwise direction of the supporting frame or a second lengthwise direction perpendicular to the first lengthwise direction, wherein each of the plurality of reinforcement portions is on a rear surface of the supporting frame.

According to some embodiments of the present disclosure, the vibration generating module includes a first sound generator configured to vibrate a first region of the rear surface of the display panel; and a second sound generator configured to vibrate a second region of the rear surface of the display panel.

According to some embodiments of the present disclosure, the supporting member includes a supporting plate at the rear surface of the display panel; a first accommodating portion in a first region of the supporting plate overlapping a first region of the rear surface of the display panel; and a second accommodating portion in a second region of the supporting plate overlapping a second region of the rear surface of the display panel.

According to some embodiments of the present disclosure, the display apparatus further includes a first heat dissipation member at the first accommodating portion; and a second heat dissipation member at the second accommodating portion.

According to some embodiments of the present disclosure, the display apparatus further includes a stiff portion disposed at the first accommodating portion and the second accommodating portion.

According to some embodiments of the present disclosure, the display apparatus further includes a stiff portion disposed between the first accommodating portion and the second accommodating portion.

According to some embodiments of the present disclosure, the display apparatus further includes a first heat dissipation member between the first accommodating portion and the stiff portion; and a second heat dissipation member between the second accommodating portion and the stiff portion.

According to some embodiments of the present disclosure, the display apparatus further includes a first heat dissipation member between the first accommodating portion and the stiff portion; and a second heat dissipation member between the second accommodating portion and the stiff portion.

According to some embodiments of the present disclosure, the display apparatus further includes a partition between the display panel and the supporting member, wherein the partition is between a first region of the rear surface of the display panel and a second region of the rear surface of the display panel.

A display apparatus according to an embodiment of the present disclosure includes a display panel configured to display an image; a front member on a front surface of the display panel; a supporting frame on a rear surface of the front member, the supporting frame including an opening overlapping the display panel; a supporting member at the opening of the supporting frame, the supporting member configured to surround a side surface of the display panel; a printed circuit board on a rear surface of the supporting member; and a vibration generating module supported by the supporting member and configured to vibrate the display panel.

According to some embodiments of the present disclosure, the supporting frame further includes a connection portion including the opening; first to third supporting portions protruding from second to fourth inner surfaces of the connection portion to the opening, but not protruding from a first inner surface of the connection portion parallel to one periphery portion of the display panel; and a plurality of fourth supporting portions protruding from the first inner surface of the connection portion to the opening.

According to some embodiments of the present disclosure, the display apparatus further includes a plurality of reinforcement portions in parallel with a first lengthwise direction of the supporting frame or a second lengthwise direction perpendicular to the first lengthwise direction, wherein each of the plurality of reinforcement portions is on a rear surface of the supporting frame.

According to some embodiments of the present disclosure, the supporting member includes a supporting plate at the rear surface of the display panel; and a plurality of accommodating portions on the supporting plate, and the vibration generating module is supported by the plurality of accommodating portions.

According to some embodiments of the present disclosure, the display apparatus further includes a stiff portion at the plurality of accommodating portions.

According to some embodiments of the present disclosure, the display apparatus further includes a stiff portion between the plurality of accommodating portions.

According to some embodiments of the present disclosure, the display apparatus further includes a heat dissipation member at each of the plurality of accommodating portions.

According to some embodiments of the present disclosure, the display apparatus further includes a stiff portion at the plurality of accommodating portions; and a plurality of heat dissipation members between each of the plurality of accommodating portions and the stiff portion.

According to some embodiments of the present disclosure, the display apparatus further includes a partition between the supporting member and the display panel.

According to some embodiments of the present disclosure, the display apparatus further includes a heat insulation member between the vibration generating module and the display panel.

A vehicle according to an embodiment of the present disclosure includes a dashboard including a first region facing a driver seat; and an instrument panel module including a first display in the first region of the dashboard, wherein the first display comprises a display apparatus including a display panel configured to display an image; a front member on a front surface of the display panel; a supporting member on a rear surface of the display panel; a supporting frame on a rear surface of the front member, the supporting frame configured to surround a side surface of the supporting member and support the supporting member; and a vibration generating module supported by the supporting member and configured to vibrate the display panel.

According to some embodiments of the present disclosure, the first display outputs a sound based on a vibration of the display panel as vibrated by the vibration generating module.

According to some embodiments of the present disclosure, the vehicle further includes a left front door, a right front door, a left rear door, a right rear door, and a rear deco; and at least one of a dashboard speaker on the dashboard, a left front door speaker at the left front door, a right front door speaker at the right front door, a left rear door speaker at the left rear door, a right rear door speaker at the right rear door, and a rear deco speaker at the rear deco.

A vehicle according to an embodiment of the present disclosure includes a dashboard including a first region facing a driver seat, a second region facing a passenger seat, and a third region between the first region and the second region; an instrument panel module including a first display in the first region of the dashboard; and an infotainment module including a second display in the third region of the dashboard, a third display in the second region of the dashboard, a fourth display on a rear surface of the driver seat, and a fifth display on a rear surface of the passenger seat, wherein at least one of the first to fifth displays comprises a display apparatus including a display panel configured to display an image; a front member on a front surface of the display panel; a supporting member on a rear surface of the display panel; a supporting frame on a rear surface of the front member, the supporting frame configured to surround a side surface of the supporting member and support the supporting member; and a vibration generating module supported by the supporting member and configured to vibrate the display panel.

According to some embodiments of the present disclosure, the at least one of the first to fifth displays outputs a sound based on a vibration of the display panel as vibrated by the vibration generating module.

A vehicle according to an embodiment of the present disclosure includes a dashboard including a display apparatus including a display panel configured to display an image; a front member on a front surface of the display panel; a supporting member on a rear surface of the display panel; a supporting frame on a rear surface of the front member, the supporting frame configured to surround a side surface of the supporting member and support the supporting member; and a vibration generating module supported by the supporting member and configured to vibrate the display panel.

It will be apparent to those skilled in the art that various modifications and variations may be made in the present disclosure without departing from the technical idea or scope of the disclosures. Thus, it may be intended that embodiments of the present disclosure cover the modifications and variations of the disclosure provided they come within the scope of the appended claims and their equivalents.

What is claimed is:

1. A display apparatus, comprising:
    a display panel configured to display an image;
    a supporting member at a rear surface of the display panel;
    a supporting frame surrounding at least one side surface of the supporting member;
    a vibration generating module supported by the supporting member, the vibration generating module being configured to vibrate the display panel;
    a front member at a front surface of the display panel; and
    a driving circuit at a rear surface of the supporting member, the driving circuit including a plurality of flexible circuit films connected to the display panel,
    wherein the supporting member is configured to support a rear surface of the vibration generating module,
    wherein a rearmost surface of the vibration generating module is disposed between the display panel and the supporting member,
    wherein the supporting member comprises:
        a supporting plate covering the rearmost surface of the vibration generating module; and
        a side portion bent from a periphery portion of the supporting plate and spaced apart from the rear surface of the display panel,
    wherein the supporting frame includes an opening accommodating the supporting member;
    wherein the supporting member is accommodated at the opening of the supporting frame,
    wherein the supporting frame further comprises:
        a connection portion at a rear periphery portion of the front member; and
        a supporting portion protruding from an inner surface of the connection portion to the opening overlapping the display panel, and
    wherein the supporting portion is configured to cover at least three surfaces of a rear periphery portion of the supporting member,
    wherein the supporting portion includes:
        first to third supporting portions protruding from second to fourth inner surfaces of the connection portion to the opening; and
        a plurality of fourth supporting portions protruding from a first inner surface of the connection portion to the opening, and
    wherein the first to third supporting portions and the plurality of fourth supporting portions overlap the rear periphery portion of the supporting member,
    wherein each of the plurality of fourth supporting portions is between the plurality of flexible circuit films, and
    wherein each of the plurality of fourth supporting portions is configured to support the rear periphery portion of the supporting member between the plurality of flexible circuit films.

2. The display apparatus of claim 1, wherein the supporting frame is configured to cover the at least three surfaces of the rear periphery portion of the supporting member.

3. The display apparatus of claim 1,
wherein the first to third supporting portions overlap the rear periphery portion of the supporting member.

4. The display apparatus of claim 1, wherein the supporting member further comprises:
at least one or more accommodating portions configured at the supporting plate to accommodate the vibration generating module.

5. The display apparatus of claim 4, wherein the supporting plate is configured to support the rearmost surface of the vibration generating module.

6. The display apparatus of claim 1,
wherein the supporting member further comprises:
a first accommodating portion at a first region of the rear surface of the display panel; and
a second accommodating portion at a second region of the rear surface of the display panel, and
wherein the vibration generating module comprises:
a first sound generator at the first accommodating portion to vibrate the first region of the display panel; and
a second sound generator at the second accommodating portion to vibrate the second region of the display panel.

7. The display apparatus of claim 6, further comprising:
a first heat dissipation member at the first accommodating portion; and
a second heat dissipation member at the second accommodating portion.

8. The display apparatus of claim 6, further comprising a stiff portion at the first accommodating portion and the second accommodating portion.

9. The display apparatus of claim 8, further comprising:
a first heat dissipation member between the first accommodating portion and the stiff portion; and
a second heat dissipation member between the second accommodating portion and the stiff portion.

10. The display apparatus of claim 6, further comprising a stiff portion between the first accommodating portion and the second accommodating portion.

11. The display apparatus of claim 10, further comprising:
a first heat dissipation member between the first accommodating portion and the stiff portion; and
a second heat dissipation member between the second accommodating portion and the stiff portion.

12. The display apparatus of claim 1, further comprising a partition between the display panel and the supporting member,
wherein the partition is between a first region of the rear surface of the display panel and a second region of the rear surface of the display panel.

13. The display apparatus of claim 1, further comprising a plurality of reinforcement portions at a rear surface of the supporting frame.

14. A vehicle, comprising:
a dashboard including a first region facing a driver seat; and
an instrument panel module including a display at the first region of the dashboard,
wherein the display comprises the display apparatus of claim 1.

15. The vehicle of claim 14, wherein the display is configured to output a sound based on a vibration of the display panel as vibrated by the vibration generating module.

16. A vehicle, comprising:
a dashboard including:
a first region facing a driver seat;
a second region facing a passenger seat; and
a third region between the first region and the second region;
an instrument panel module including a first display at the first region of the dashboard; and
an infotainment module including:
a second display at the third region of the dashboard;
a third display at the second region of the dashboard;
a fourth display at a rear surface of the driver seat; and
a fifth display at a rear surface of the passenger seat,
wherein at least one of the first to fifth displays comprises the display apparatus of claim 1.

17. The vehicle of claim 16, wherein the at least one of the first to fifth displays is configured to output a sound based on a vibration of the display panel as vibrated by the vibration generating module.

18. The vehicle of claim 16, further comprising:
a left front door;
a right front door;
a left rear door;
a right rear door;
a rear deco; and
at least one of:
a dashboard speaker at the dashboard;
a left front door speaker at the left front door;
a right front door speaker at the right front door;
a left rear door speaker at the left rear door;
a right rear door speaker at the right rear door; and
a rear deco speaker at the rear deco.

19. A vehicle, comprising:
a dashboard including the display apparatus of claim 1.

20. A display apparatus, comprising:
a display panel configured to display an image;
a supporting member at a rear surface of the display panel and including at least one or more accommodating portions;
a supporting frame at a rear surface of the supporting member;
a vibration generating module supported by the supporting member, and configured to vibrate the display panel and accommodate in the at least one accommodating portions; and
a driving circuit at the rear surface of the supporting member, the driving circuit including a plurality of flexible circuit films connected to the display panel,
wherein the supporting frame includes an opening accommodating the supporting member,
wherein the supporting member is accommodated at the opening of the supporting frame,
wherein a rearmost surface of the vibration generating module is disposed between the display panel and the supporting member,
wherein the supporting member comprises:
a supporting plate covering the rearmost surface of the vibration generating module; and
a side portion bent from a periphery portion of the supporting plate and spaced apart from the rear surface of the display panel,
wherein the supporting frame further comprises:
a connection portion including the opening; and
first to third supporting portions protruding from second to fourth inner surfaces of the connection portion to the opening,
wherein the first to third supporting portions overlap a rear periphery portion of the supporting member, wherein the supporting frame further comprises a plurality of fourth supporting portions protruding from a first inner surface of the connection portion to the opening, wherein the first to third supporting portions and the plurality of fourth supporting portions overlap the rear periphery portion of the supporting member, and wherein each of the plurality of fourth supporting portions is configured to support the rear periphery portion of the supporting member between the plurality of flexible circuit films.

21. The display apparatus of claim 20, further comprising a front member at a front surface of the display panel, wherein the connection portion is connected to a rear periphery portion of the front member.

22. The display apparatus of claim 20, wherein:

the supporting plate is configured to support the rearmost surface of the vibration generating module; and the at least one or more accommodating portions is configured at the supporting plate to accommodate the vibration generating module.

23. The display apparatus of claim 20, wherein the at least one or more accommodating portions comprises:

a first accommodating portion at a first region of the rear surface of the display panel; and a second accommodating portion at a second region of the rear surface of the display panel, and wherein the vibration generating module comprises:

a first sound generator configured to vibrate the first region of the rear surface of the display panel; and a second sound generator configured to vibrate the second region of the rear surface of the display panel.

24. The display apparatus of claim 23, further comprising:

a first heat dissipation member at the first accommodating portion; and a second heat dissipation member at the second accommodating portion.

25. The display apparatus of claim 23, further comprising a stiff portion at the first accommodating portion and the second accommodating portion.

26. The display apparatus of claim 20, further comprising:

a plurality of reinforcement portions in parallel with a first lengthwise direction of the supporting frame or a second lengthwise direction perpendicular to the first lengthwise direction, wherein each of the plurality of reinforcement portions is at a rear surface of the supporting frame.

27. A vehicle, comprising:

a dashboard including a first region facing a driver seat; and an instrument panel module including a display at the first region of the dashboard, wherein the display comprises the display apparatus of claim 20.

28. The vehicle of claim 27, wherein the display is configured to output a sound based on a vibration of the display panel as vibrated by the vibration generating module.

29. A vehicle, comprising:

a dashboard including:

a first region facing a driver seat;

a second region facing a passenger seat; and a third region between the first region and the second region;

an instrument panel module including a first display at the first region of the dashboard; and an infotainment module including:

a second display at the third region of the dashboard;

a third display at the second region of the dashboard;

a fourth display at a rear surface of the driver seat; and a fifth display at a rear surface of the passenger seat, wherein at least one of the first to fifth displays comprises the display apparatus of claim 20.

30. The vehicle of claim 29, wherein the at least one of the first to fifth displays is configured to output a sound based on a vibration of the display panel as vibrated by the vibration generating module.

31. The vehicle of claim 29, further comprising:

a left front door;

a right front door;

a left rear door;

a right rear door;

a rear deco; and at least one of:

a dashboard speaker at the dashboard;

a left front door speaker at the left front door;

a right front door speaker at the right front door;

a left rear door speaker at the left rear door;

a right rear door speaker at the right rear door; and a rear deco speaker at the rear deco.

32. A vehicle, comprising:

a dashboard including the display apparatus of claim 20.

* * * * *